US 6,735,723 B2

(12) United States Patent
Park et al.

(10) Patent No.: US 6,735,723 B2
(45) Date of Patent: May 11, 2004

(54) APPARATUS AND METHOD FOR PROCESSING INTERLEAVING/DEINTERLEAVING WITH ADDRESS GENERATOR AND CHANNEL ENCODING SYSTEM USING THE SAME

(75) Inventors: Hyung-Il Park, Taejon (KR); Ik-Soo Eo, Taejon (KR); Kyung-Soo Kim, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 461 days.

(21) Appl. No.: 09/750,186

(22) Filed: Dec. 29, 2000

(65) Prior Publication Data

US 2002/0062464 A1 May 23, 2002

(30) Foreign Application Priority Data

Oct. 11, 2000 (KR) ........................................ 2000-59749

(51) Int. Cl.[7] .............................................. G06F 11/00
(52) U.S. Cl. ........................ 714/701; 714/763; 375/372
(58) Field of Search ................................. 714/701, 768, 714/49, 763; 375/372; 340/172.5; 395/164, 325, 477; 711/151

(56) References Cited

U.S. PATENT DOCUMENTS

| 3,665,405 | A | * | 5/1972 | Sanders et al. | ........... | 340/172.5 |
| 5,107,456 | A | * | 4/1992 | Schuur | ........... | 395/325 |
| 5,544,306 | A | * | 8/1996 | Deering et al. | ........... | 395/164 |
| 5,627,994 | A | * | 5/1997 | Levy et al. | ........... | 395/477 |
| 5,636,224 | A | | 6/1997 | Voith et al. | | |
| 5,764,649 | A | | 6/1998 | Tong | | |
| 5,828,671 | A | | 10/1998 | Vela et al. | | |
| 5,928,371 | A | | 7/1999 | Robinson, Jr. et al. | | |
| 5,940,863 | A | | 8/1999 | Fimoff et al. | | |
| 6,009,544 | A | | 12/1999 | Nara | | |
| 6,035,428 | A | | 3/2000 | Jekal | | |
| 6,507,629 | B1 | * | 1/2003 | Hatakeyama | ........... | 375/372 |

FOREIGN PATENT DOCUMENTS

JP 409091953 A * 4/1997

OTHER PUBLICATIONS

Mustafa Eroz, et al.; On the Design of Prunable Interleavers for Turbo Codes; 1999 IEEE; pp. 1669–1673.

* cited by examiner

Primary Examiner—Albert Decady
Assistant Examiner—Dipakkumar Gandhi
(74) Attorney, Agent, or Firm—Jacobson Holman PLLC

(57) ABSTRACT

An interleaving/deinterleaving processing method, a channel encoding system using it and a computer readable recording media for realizing it is provided. The interleaver includes: an interleaving storing unit for storing data sequence; the writing address generating unit for obtaining inter-location offset of a memory on which symbols are to be written in order to perform a writing operation and for generating a writing address to be practically written on, data and a memory control signal; an address offset generating unit for receiving a middle value (MID_OFF) and a start signal from the writing address generating unit, the middle value and the start signal being used for obtaining an offset between an inter-location offset of the memory; a reading address generating unit for generating increasing the address offset generating unit originated signal to as much as a symbol's memory inter-location offset; the first and the second selecting unit for selecting appropriate signal between a control signal and address in the writing address generating unit and the reading address generating unit transferred writing operation needed reading operation, and in a real interleaving operation needed reading operation; and a third selecting unit for selecting appropriate symbol in the memory output signals and performed from the reading address generating unit transferred interleaving.

27 Claims, 16 Drawing Sheets

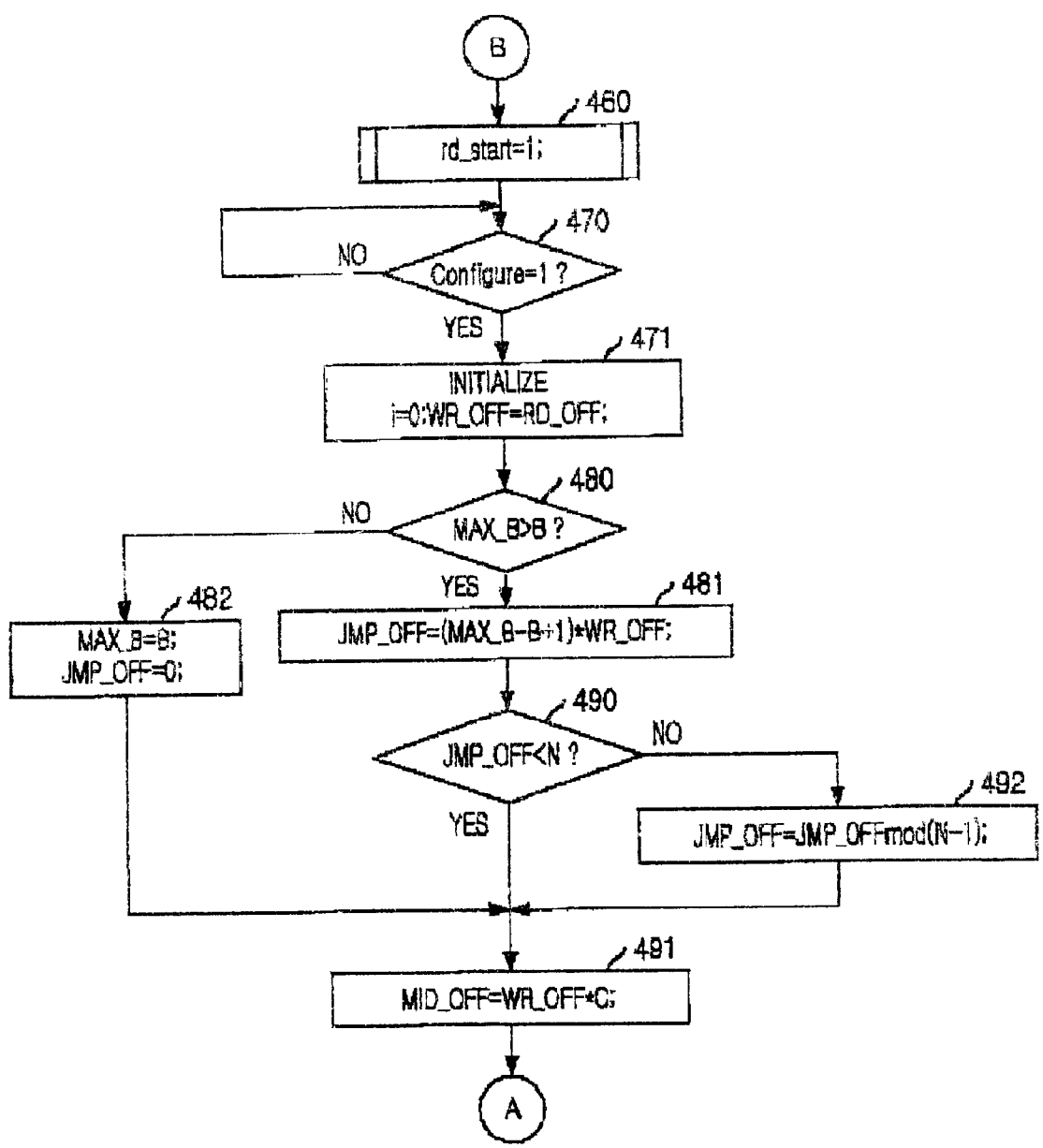

FIG. 7

710 ASSUMPTION:
TTI=40ms, C=4, N=24, B=6
WIDTH OF FIRST INTERLEAVER RAM=6
WR_OFF=RD_OFF OF PREVIOUS FRAME(INIT=1)
COL_OFF=WR_OFF*DIFF_COL_IDX
DIFF_COL_IDX=real_COL-(prev_COL+1)
WR_IDX=WR_IDX_WR_OFF
RD_OFF=WR_OFF*C
RD_IDX=RD_IDX+RD_OFF+COL_OFF+JAM_OFF

720 SOURCE DATA

| 0 | 1 | 2 | 3 |
|---|---|---|---|
| 4 | 5 | 6 | 7 |
| 8 | 9 | 10 | 11 |
| 12 | 13 | 14 | 15 |
| 16 | 17 | 18 | 19 |
| 20 | 21 | 22 | 23 |

730 INTERLEAVED DATA

| COLUMN-0 | 0 | 4 | 8 | 12 | 16 | 20 |
|---|---|---|---|---|---|---|
| COLUMN-2 | 2 | 6 | 10 | 14 | 18 | 22 |
| COLUMN-1 | 1 | 5 | 9 | 13 | 17 | 21 |
| COLUMN-3 | 3 | 7 | 11 | 15 | 19 | 23 |

COLUMN ORDER : 0→2→1→3

740 WR_OFF=1:   <= INITIAL VALUE

| SRC INDEX | MEM INDEX | RD_IDX CALCULATION |
|---|---|---|
| 0 | 0 | 0 |
| 1 | 1 | 0+1 |
| 2 | 2 | 1+1 |
| ... | | |
| 23 | 23 | 22+1 |

770 WR_OFF=4:

| SRC INDEX | MEM INDEX | RD_IDX CALCULATION |
|---|---|---|
| 0 | 0 | 0 |
| 1 | 4 | 0+4 |
| 2 | 8 | 4+4 |
| ... | | |
| 23 | 23 | 22+4 |

750

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |

780

| 0 | 6 | 12 | 18 | 1 | 7 | 13 | 19 |
|---|---|---|---|---|---|---|---|
| 2 | 8 | 14 | 20 | 3 | 9 | 15 | 21 |
| 4 | 10 | 16 | 22 | 5 | 11 | 17 | 23 |

760 WR_OFF=4, JMP_OFF=0

| DOUT INDEX | SRC INDEX | MEM INDEX | RD_IDX CALCULATION |
|---|---|---|---|
| 0 | 0 | 0 | 0 |
| 1 | 4 | 4 | 0+4+0+0 |
| ... | | | |
| 5 | 20 | 20 | 16+4+0+0 <= col-0 end |
| 6 | 2 | 2 | 20+4+1+0=25-23=2 |
| 7 | 6 | 6 | 2+4+0+0 |
| ... | | | |
| 11 | 22 | 22 | 18+4+0+0 <= col-2 end |
| 12 | 1 | 1 | 22+4-2+0=24-23=1 |
| ... | | | |
| 23 | 23 | 23 | 19+4+0+0 |

790 WR_OFF=4:

| DOUT INDEX | SRC INDEX | MEM INDEX | RD_IDX CALCULATION |
|---|---|---|---|
| 0 | 0 | 0 | 0 |
| 1 | 4 | 16 | 0+16+0+0 |
| ... | | | |
| 5 | 20 | 11 | 18+16+0+0 <= col-0 end |
| 6 | 2 | 8 | 11+16+4+0=31-23=8 |
| 7 | 6 | 1 | 8+16+0+0=24-23=1 |
| ... | | | |
| 11 | 22 | 19 | 3+16+0+0 <= col-2 end |
| 12 | 1 | 4 | 19+16-8+0=27-23=4 |
| ... | | | |
| 23 | 23 | 23 | 7+16+0+0 |

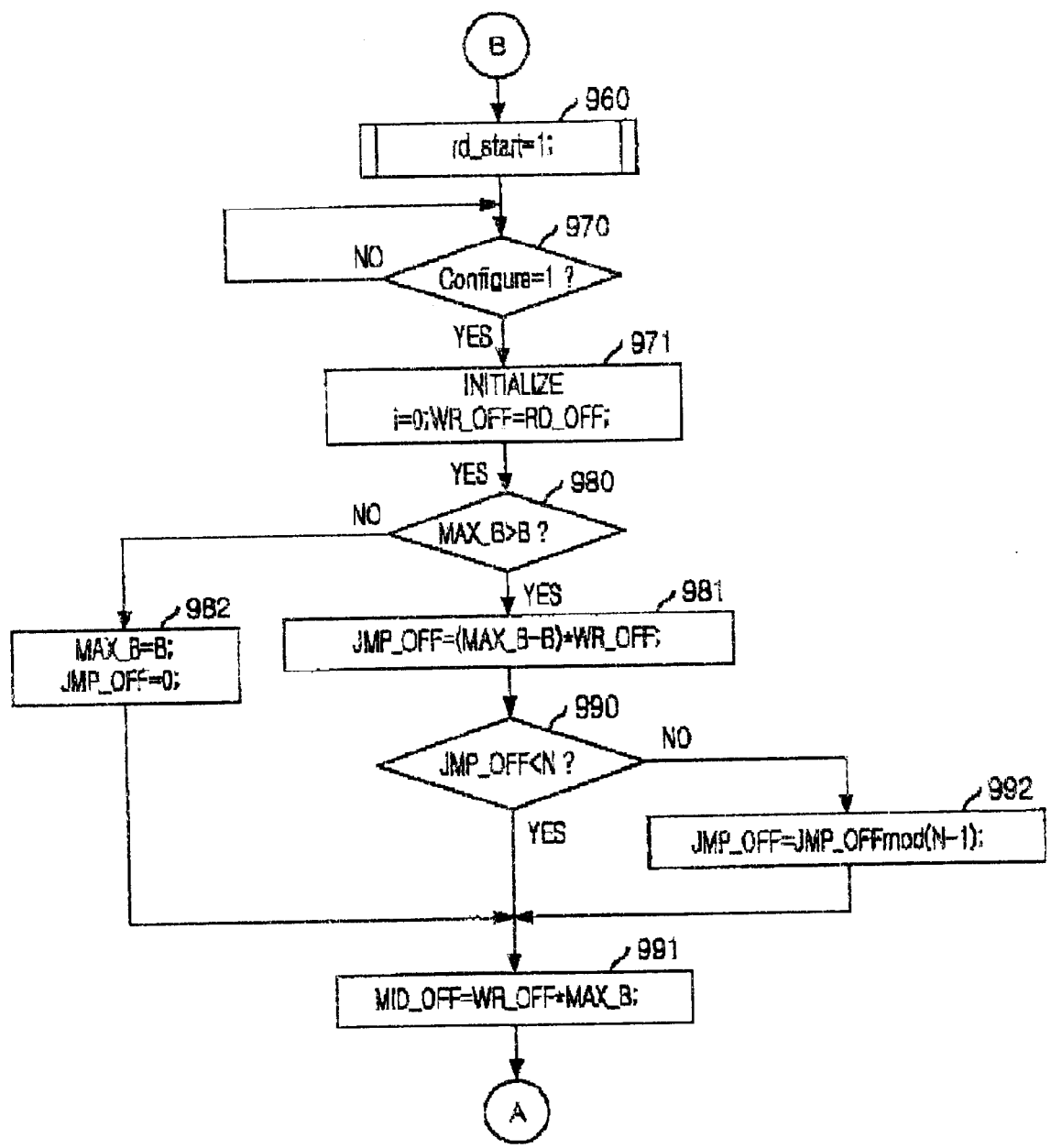

FIG. 12

ASSUMPTION: /1210
TTI=40ms, C=4, N=24, B=6
WIDTH OF FIRST INTERLEAVER RAM=6
WR_OFF=RD_OFF OF PREVIOUS FRAME(INIT=1)
COL_OFF=WR_OFF*B*DIFF_COL_IDX
DIFF_COL_IDX=real_COL-(prev_COL+1)
WR_IDX=WR_IDX+WR_OFF+COL_OFF+JAM_OFF
RD_OFF=WR_OFF*B
RD_IDX=RD_IDX+RD_OFF

| SOURCE DATA /1220 | | | |
|---|---|---|---|
| 0 | 1 | 2 | 3 |
| 4 | 5 | 6 | 7 |
| 8 | 9 | 10 | 11 |
| 12 | 13 | 14 | 15 |
| 16 | 17 | 18 | 19 |
| 20 | 21 | 22 | 23 |

| INTERLEAVED DATA /1230 | | | | | | |
|---|---|---|---|---|---|---|
| COLUMN-0 | 0 | 4 | 8 | 12 | 16 | 20 |
| COLUMN-2 | 2 | 6 | 10 | 14 | 18 | 22 |
| COLUMN-1 | 1 | 5 | 9 | 13 | 17 | 21 |
| COLUMN-3 | 3 | 7 | 11 | 15 | 19 | 23 |

COLUMN ORDER: 0→2→1→3

WR_OFF=1, JMP_OFF=0  /1240

| DOUT INDEX | SRC INDEX | MEM INDEX | RD_IDX CALCULATION |
|---|---|---|---|
| 0 | 0 | 0 | 0 |
| 1 | 4 | 1 | 0+1+0+0 |
| ... | | | |
| 5 | 20 | 5 | 4+1+0+0 <= col-0 end |
| 1 | 4 | 4 | 5+1+6+0=12 |
| 7 | 6 | 13 | 12+1+0+0 |
| ... | | | |
| 11 | 22 | 17 | 16+1+0+0 <= col-2 end |
| 12 | 1 | 6 | 17+1-12+0=6 |
| ... | | | |
| 23 | 23 | 23 | 22+1+0+0 |

WR_OFF=4  /1270

| DOUT INDEX | SRC INDEX | MEM INDEX | RD_IDX CALCULATION |
|---|---|---|---|
| 0 | 0 | 0 | 0 |
| 1 | 4 | 6 | 0-6+0+0 |
| ... | | | |
| 5 | 20 | 7 | 1+6+0+0 <= col-0 end |
| 6 | 2 | 3 | 7+6+13+0=26-23=3 |
| 7 | 6 | 9 | 3+6+0+0 |
| ... | | | |
| 11 | 22 | 10 | 4+6+0+0 <= col-2 end |
| 12 | 1 | 13 | 10+6+20+0=36-23=13 |
| ... | | | |
| 23 | 23 | 23 | 17+16+0+0 |

/1250

| 0 | 4 | 8 | 12 | 16 | 20 | 1 | 5 |
|---|---|---|---|---|---|---|---|
| 9 | 13 | 15 | 21 | 2 | 6 | 10 | 14 |
| 18 | 22 | 3 | 7 | 11 | 15 | 19 | 23 |

/1280

| 0 | 16 | 9 | 2 | 18 | 11 | 4 | 20 |
|---|---|---|---|---|---|---|---|
| 13 | 6 | 22 | 15 | 8 | 1 | 17 | 10 |
| 3 | 19 | 12 | 5 | 21 | 14 | 7 | 23 |

RD_OFF=1*6=6  /1260

| DOUT INDEX | SRC INDEX | MEM INDEX | RD_IDX CALCULATION |
|---|---|---|---|
| 0 | 0 | 0 | 0 |
| 1 | 1 | 6 | 0+6 |
| 2 | 2 | 12 | 6+6 |
| ... | | | |
| 23 | 23 | 23 | 17+6 |

RD_OFF=6*6=36mod23=13  /1290

| DOUT INDEX | SRC INDEX | MEM INDEX | RD_IDX CALCULATION |
|---|---|---|---|
| 0 | 0 | 0 | 0 |
| 1 | 1 | 13 | 0+13 |
| 2 | 2 | 3 | 13+13=26-23=3 |
| ... | | | |
| 23 | 23 | 23 | 10+13 |

APPARATUS AND METHOD FOR PROCESSING INTERLEAVING/DEINTERLEAVING WITH ADDRESS GENERATOR AND CHANNEL ENCODING SYSTEM USING THE SAME

FIELD OF THE INVENTION

The present invention relates to an interleaving/deinterleaving processing method, a channel encoding system using it and a computer readable recording media for realizing it, and more particularly, to a method for realizing a inter-column substitution including interleaving/deinterleaving processing apparatus and method and thereof adopt reading media which can read the program, wherein the interleaving/deinterleaving operation processing apparatus and method which is used in error correction generated from a channel environment of mobile communication.

That is, the present invention embodiment the interleaving/deinterleaving, which is essential in realizing CDMA mobile communication system, and using strong application technology for effective and correct signal transfer. Especially, in mobile communication, there generated burst error by multi-channel caused multi-fading. So a codification and an interleaving can make effective transfer by changing a burst error to a random error.

DESCRIPTION OF THE PRIOR ART

In an international mobile telecommunication-2000 (IMT-2000), an interleaving/deinterleaving processing apparatus is accepted to a transmission time interval (TTI) and an utmost transfer rate is reached to 2 Mbps. At this time, transfer time interval is structured to 10~80 ms, so assuming that 384 Kbps data rate and 80 ms transfer time interval, then a memory for a first interleaving is reached to 553 Kbits, and if two RAM is used for reading and writing according to a conventional method, a memory which using the interleaving over 1 Mbits and occupied almost whole area of the chip. Moreover, thereof needed a second deinterleaving and a memory for the first and the second interleaving, so memory downsizing is necessary for making high data rate supply modem in one chip.

Another characteristics is performing an inter-column substitute before a block interleaving performing.

In here, refer to the conventional interleaving/deinterleaving structure.

First, in a three memory used structure, one is used for storing input data, another is used for the interleaving/deinterleaving sequence same as for the first memory reading address storing and the other is for storing the interleaving/deinterleaving result.

Second, improving the first structure, instead of storing the interleaving/deinterleaving sequence in the memory, producing an address through a counting machine. This structure uses two memory which divided in two structure following its use; one is uses two memory for storing input data and the interleaving/deinterleaving result, the other uses the memory for reading and writing, in turn.

Third, one memory use structure, reach to the inputted sauce data memory in two-dimension so writes in column direction, reads in column direction and changes the direction in turn.

The first and the second structure are easy in embodiment, but the memory size is fixed from 384 Kbps to 2 Mbps reached high data rate required application, so they are not good for applying in a terminal but the third structure is efficient.

However, in the IMT-2000, the interleaving process method performing inter-column substitution before a simple block interleaving, so simple column and row substitute method cannot complete the process. Because the inter-column substitution need nonlinear structure instead of the two-dimensional structure.

The conventional interleaving/deinterleaving method considers processing timing, and use two memories and during one memory writes input data, the other memory reads storing data. This method has an advantage of obtaining enough processing timing because the memory has small size when a data rate is low. However, considering an increased data and memory size, using two memories is not an advantage any more.

Furthermore, in the IMT-2000 standard, the first interleaver operates to the transfer time interval, up to 80 ms, and to receive this, the memory size has to be larger in proportion to the data rate and transfer time interval. So using two memories is resulted in make a chip to a several or using an outer memory. Therefore, memory size downsizing for the interleaving/deinterleaving to realize one modem to one chip is very important. Furthermore, different from the conventional interleaving performing method, the inter-column is preceded, so when uses one memory in writing and in reading, in column and in row respectively, To consider the above, performing the interleaving/deinterleaving by using one memory to downsizing the memory size and making one chip modem which can support high data rate needed service is required.

SUMMARY OF THE INVENTION

It is, therefore, an object of the present invention to provide an apparatus and a method for processing data burst error correction used an interleaving/deinterleaving, and an address generator to write data in basic read position by generating an address, and using one memory, records the next data thereof, and using channel encoder system to realize it.

In accordance with a first embodiment of the present invention, there is provided an interleaving performing device, including: an interleaving storing unit for sequence storing which is inputted from a writing address generating unit and from a first and a second selecting unit; the writing address generating unit for demanding a memory inter-location offset (WR_OFF) to performing a writing operation in the interleaving storing unit memory block and for generating a practically writing address, data and memory control signal; an address offset generating unit for inputting a middle value (MID_OFF) and a start signal (cal_start) for demand a memory inter-location offset (RD_OFF) from the writing address generating unit, to read in an interleaving sequence and for generating an intermediate variable (COL_OFF) which is used for the memory inter-location offset (RD_OFF) and an inter-column substitution; a reading address generating unit for increasing the address offset generating unit originated signal to as much as a symbol's memory inter-location offset (RD_OFF) and create an address for reading the interleaving storing unit to generate memory control signal; the first and the second selecting unit for selecting appropriate signal between a control signal and address in the writing address generating unit and the reading address generating unit transferred writing operation needed reading operation, and in a real interleaving operation needed reading operation; and a third selecting unit for selecting appropriate symbol in the memory output signals which are generated from the reading operation, and performed from the reading address generating unit transferred interleaving.

In accordance with a second embodiment of the present invention, there is provided a deinterleaving performing device, including: an deinterleaving storing unit for sequence storing which is inputted from a writing address generating unit and from a first and a second selecting unit; the writing address generating unit for demanding memory an inter-location offset (WR_OFF) to performing a writing operation in the deinterleaving storing unit memory block and for generating practically writing address, data and memory control signal; an address offset generating unit for inputting a middle value (MID_OFF) and a start signal (cal_start) for demand a memory inter-location offset (RD_OFF) from the writing address generating unit, to read in deinterleaving sequence and for generating an intermediate variable (COL_OFF) which is used for a memory inter-location offset (RD_OFF) and an inter-column substitution; a reading address generating unit for increasing the address offset generating unit originated signal to as much as a symbol's memory inter-location offset (RD_OFF) and create an address for reading the deinterleaving storing unit to generate memory control signal; the first and the second selecting unit for selecting appropriate signal between a control signal and address in the writing address generating unit and the reading address generating unit transferred writing operation needed reading operation, and in a real interleaving operation needed reading operation; and a third selecting unit for selecting appropriate symbol in the memory output signals which are generated from the reading operation, and performed from the reading address generating unit transferred deinterleaving.

In accordance with a third embodiment of the present invention, there is provided a channel encoding system which is using data burst error correction used the interleaving/deinterleaving performing device, including: an encoding unit for encoding inputted sauce's data column; an interleaving unit for performing inter-column included block interleaving, to the encoding unit transferred data; a modulating unit for modulating block interleaved data through the interleaving unit and transfer it through a channel; a demodulating unit for demodulating the block interleaved data which is modulated through the modulating unit; a deinterleaving unit for performing an inter-column substitution included block deinterleaving to the block interleaved data which is demodulated through the demodulating unit; and a decoding unit for decoding the deinterleaved data by the deinterleaving unit.

In accordance with a forth embodiment of the present invention, there is provided a interleaving performing method for data burst error correction used interleaving performing device, including the steps of: a) storing input sequence of writing address generator, a first and a second multiplexing device; b) obtaining a memory inter-location offset (WR_OFF) in a successively inputted symbol which will be written, and for performing a writing operation in the stored memory block; c) generating a memory inter-location offset (RD_OFF) which is inputting a middle value and a start signal (cal_start) for reading it in an interleaving sequence, and a medium variable (COL_OFF) which is used in an inter-column substitution; d) increasing the generated signal to a successively readable symbol's memory inter-location's offset (RD_OFF), and generating memory control signal for reading a stored interleaver RAM; e) choosing a corresponding cycle needed signal between the reading address generator and the writing address generator transferred writing operation needed reading operation and a real interleaving performing needed reading operation's control signal and address; and f) choosing a corresponding symbol between the memory output signals which are generated by the reading address generator transferred interleaving performing reading operation.

In accordance with a fifth embodiment of the present invention, there is provided a deinterleaving performing method for data burst error correction used deinterleaving performing device, including the steps of: a) storing frame symbol of inputting from a writing address generator, a first and a second multiplexing device; b) obtaining a memory deinter-location offset (WR_OFF) in a successively inputted symbol which will be written, and for performing a writing operation in the stored memory block; c) generating a memory inter-location offset (RD_OFF) which is inputting a middle value and a start signal (cal_start) for reading it in deinterleaving sequence, and a medium variable (COL_OFF) which is used in an inter-column substitution restoration; d) increasing the generated signal to a successively readable symbol's memory inter-location's offset (RD_OFF), and generating memory control signal for reading a stored interleaver RAM; e) choosing a corresponding cycle needed signal between the reading address generator and the writing address generator transferred writing operation needed reading operation and a real interleaving performing needed reading operation's control signal and address; and f) choosing a corresponding symbol between the memory output signals which are generated by the reading address generator transferred deinterleaving performing reading operation.

In accordance with a sixth embodiment of the present invention, there is provided an interleaving/deinterleaving performing method including the steps of: handling an interleaving/deinterleaving performing source data (interleaving)'s frame (block) or an interleaved data (deinterleaving) frame block, storing it in a memory; regarding the storing frame as a former frame, during the interleaving/deinterleaving, the former frame next corresponded symbol is inputted and needs the memory which can store it; and writing according to the previous symbol reading position for the next frame corresponded symbol, without adding the memory.

In accordance with a seventh embodiment of the present invention, there is provided a computer readable recording media including: a first function for correcting burst error of data, using one memory, considering an interleaving sequence followed a read position, for writing next data, in processor possessed interleaving performing device, inputting writing address generator and a first and a second multiplex device, storing an input sequence; a second function for performing a writing operation in a stored memory block, demanding successively inputted symbol used a memory inter-location offset (WR_OFF), generating a real usable address, data, and a memory control signal; a third function for generating an inter-column substitution used medium variable (COL_OFF) and a memory inter-location offset (RD_OFF) for inputting a medium value (MID_OFF) and a start signal (cal_start), and reading it an interleaving sequence; a forth function for increasing the generating signal to as much as a successively readable symbol inter-location's offset (RD_OFF), and making an address for reading an above stored interleaver RAM, then generating a memory control signal; a fifth function for selecting respectively between the reading operation which is needed for the writing address generator and reading address generator transferred writing operation and a real interleaving performing needed reading operation's control signal and address; and a sixth function for selecting corresponding symbol between the reading address generator transferred interleaving performing reading operation generated memory output signals.

In accordance with a eighth embodiment of the present invention, there is provided a computer readable recording media including: a first function for correcting a burst error of data, using one memory, considering a deinterleaving sequence followed read position, for writing next data, in processor possessed deinterleaving performing device, inputting a writing address generator and a first and a second multiplex device, storing an input sequence; a second function for performing writing operation in the stored memory block, demanding successively inputted symbol used a memory inter-location offset (WR_OFF), generating a real usable address, data, and a memory control signal; a third function for generating an inter-column substitution restore used a medium variable (COL_OFF) and a memory inter-location offset (RD_OFF) for inputting a medium value (MID_OFF) and a start signal (cal_start), and reading it in a deinterleaving sequence; a forth function for increasing the generating signal to as much as a successively readable symbol inter-location's offset (RD_OFF), and making an address for reading an above stored deinterleaver RAM, then generating memory control signal; a fifth function for selecting respectively between the reading operation which is needed for the writing address generator and reading address generator transferred writing operation and a real interleaving performing needed reading operation's control signal and an address; and a sixth function for selecting corresponding symbol between the reading address generator transferred deinterleaving performing reading operation generated memory output signals.

In the present invention, inter-column storing and one memory using structure is basically using one memory following the interleaving/deinterleaving sequence, and considering the inter-column substitution, record next data. Considering following three major points, first, it performed a writing operation according to the reading sequence, so it needs a calculation for the next reading sequence, displacement and for the inter-column substitution restoring used offset. Second, as a method of ensuring the maximum processing timing, speedy and simultaneous operation performable hardware structure is needed. Third, there needs a consideration of data rate changing, that is, changing of an inputted data block size.

BRIEF DESCRIPTION OF THE DRAWINGS

Other objects and aspects of the invention will become apparent from the following description of the embodiments with reference to the accompanying drawings, in which:

FIGS. 4a and 4b are flow chart showing an interleaving used writing address generating method among the interleaving/deinterleaving performing method in accordance with the present invention;

FIG. 7 is a flow chart showing an inter-column substitution included block interleaving performing method among the interleaving/deinterleaving performing methods in accordance with the present invention;

FIGS. 9a and 9b are flow chart showing an interleaving used writing address generating method among the interleaving/deinterleaving performing methods in accordance with the present invention;

FIG. 12 is a diagram showing an inter-column included block interleaved data's deinterleaving performing process among the interleaving/deinterleaving performing methods in accordance with the present invention.

DETAILED DESCRIPTION OF THE PREFERRED EMBODIMENTS

Figure 1:
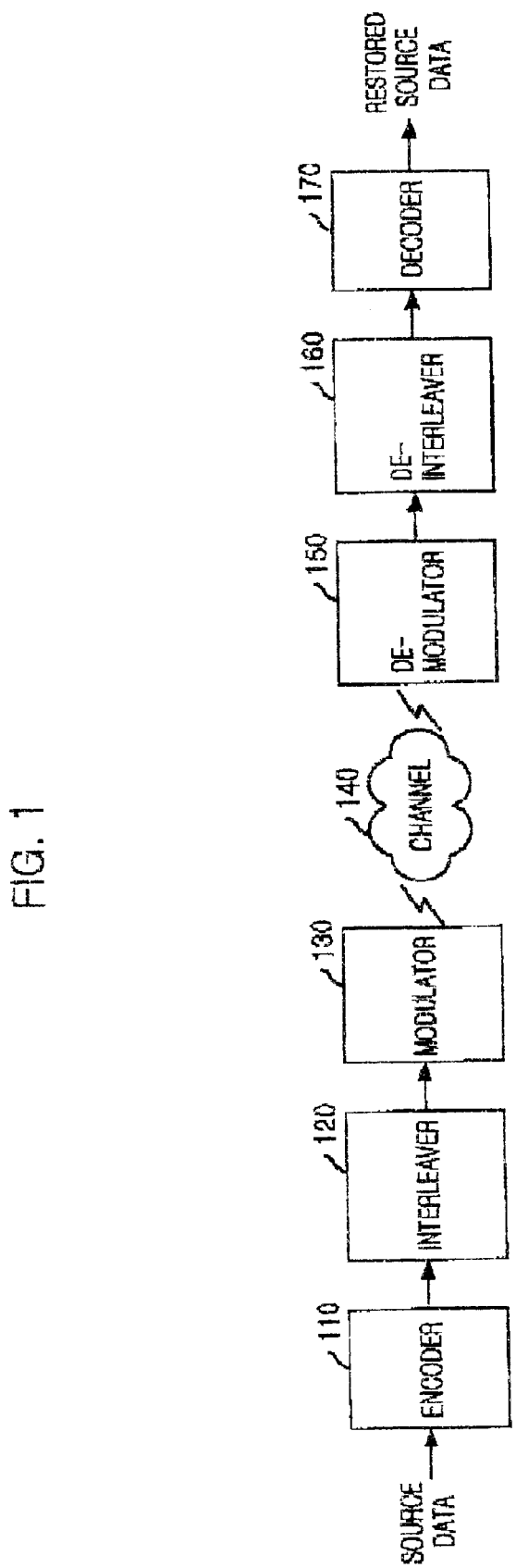
FIG. 1 is a diagram illustrating an interleaving used channel-encoding system in accordance with the present invention.

FIG. 1 is a diagram illustrating an interleaving used channel-encoding system in accordance with the present invention.

As described in FIG. 1, a fading influences a signal through a mobile communication channel. A correction algorithm can restore the error by proper signal power. That is, most of an error correction algorithm is powerful to a random error. However, a burst error decreases the error correction efficiency. An interleaving/deinterleaving is invented to prevent the burst error from a channel by receiving an encoded data column and mix it. And in the receiving part, performing a received data column anti-mix operation before performing a decoding to make a random error.

Therefore, as shown in FIG. 1, in the interleaving/deinterleaving used channel encoding system, an inputted source's data column is encoded by a encoder 110 which uses a weave encode or a turbo encode, and the interleaving is performed by an interleaver 120, modulated by a modulator 130 and transferred through a channel 140. Then, receiving the transferred data to demodulate through a demodulator, performing a deinterleaving in a deinterleaver 160, and restore the transmitted source data though a decoder 170.

Figure 2:
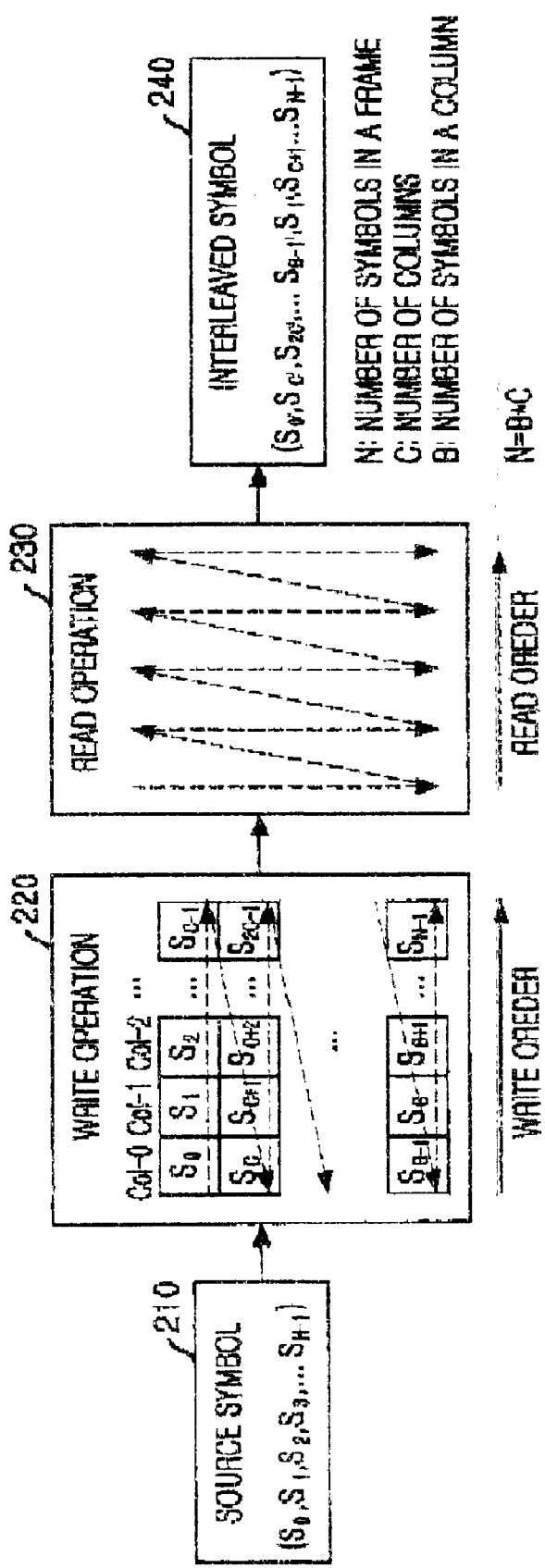
FIG. 2 is a diagram showing a simple block interleaving operation method in accordance with the present invention.

FIG. 2 is a diagram showing a simple block interleaving performing method in accordance with the present invention.

As described in FIG. 2, in a source symbol 210, an ex-interleaving symbols are donated to $S_0, S_1, S_2, S_3, \ldots S_{N-1}$. And in a write operation 220, a source symbol's 210 column is described by an arrow mark, then the source symbol 210 is denoted by dimensional array. In this time, if presume the number of column to a C and the number of row to a B, then N=C*B. After this, when performing the interleaving, read the column. A reading sequence is presented as an arrow mark in a read operation 230, and a sequence of a post interleaving performing symbol is presented in an interleaved symbol 240.

As described, in the IMT-2000, an inter-column substitution is executed before the block interleaving. That is, for the interleaving, a reading is followed by the column and the sequence or the column is chasing a predetermined sequence.

The IMT-2000 used interleaving performing method is as follow, and particularly, about the characteristics of the first interleaver.

a) Choosing a column number in the chart 1 according to TTI.
b) A row number is the divided number of a whole inputted bit number into column number.
c) Arranging to the determined row and the column, and records input sequence to the row.
d) Reading to the chart 1.

TABLE 1

| TTI | No. of column | Inter-column substitution pattern |
|---|---|---|
| 10 ms | 1 | {0} |
| 20 ms | 2 | {0, 1} |
| 40 ms | 4 | {0, 2, 1, 3} |
| 80 ms | 8 | {0, 4, 2, 6, 1, 5, 3, 7, } |

As described in the above Table 1, the inter-column substitution is performed before a general block interleaving method is carried out. That is, if RRI is 40 ms, a sequence of numbers which are used in the interleaving are 0, 2, 1 and 3.

Meanwhile, the term and a medium variable which is used in the present invention is as below:

frame: a data block unit for performing one interleaving/deinterleaving
N: one frame included symbol number. In chart 1, number of per TTI symbol.
C: Number of column. In chart 1, determined by TTI.
B: one column included symbol number. N/C.
MAS_B: one column included maximum symbol number. Basic value is 0, and then renovated by comparing with β value.
WR_INX: memory location, which will write a currently inputted symbol.
WR_OFF: memory inter-location offset, which will write a successively inputted symbol.
JMP_OFF: in case of undecreasing data rate, this medium variable makes a skip in an unusable region.
MID_OFF: a mid value for obtains RD_OFF. Comparing N, in case of larger or same, obtains "modulo" calculation and in smaller case, obtains RD_OFF.
RD_IDX: memory location of currently readable symbol.
RD_OFF: memory inter-location offset, which will be successively readable.
COL_OFF: medium variable used for inter-column substitution.
DIFF_COL_ICX: difference value between column indexes for calculating COL_OFF.

According to the above definition, indexes which are inputted in one frame are expressed to $0, 1, 2, \ldots, N-1$, and if an index of a first inputted symbol is 0 and an index of a last is $N-1$, then they are written in an interleaver memory in sequence. If an output of an "i" interleaver is defined to DOUT(i), it is described as below [formula 1].

[Formula 1]

$$DOUT(i)=SOURCE(2^M(i \bmod B)+BRO_M(\lfloor i/B \rfloor)) \quad (0 \leq i \leq N-1)$$

In here, $2^M$ is same as a column number C, $\lfloor x \rfloor$ means the biggest integer which is smaller or same as x, and $BRO_M(y)$ is a calculation which broaden a "y" to M bit, then change bit sequence. The above [formula 1] is only possible when a number of the columns are illustrated to an index number of 2, like the first interleaving. However, in case of a second interleaver, the [Formula 1] is not accepted because the number of column is fixed to 30. So using the following formula is better.

For i in 0 to (N−1) loop
If i=0 then
J<=0;
elsif (i mod B)/=0 then $$j<=j+C; \quad (1)$$

else $$j<=j+C+DIFF\_COL\_IDX; \quad (2)$$

end if;
if j>N−1 then $$j<=j-(N-1);$$

end if;
DOUT(i)<=SOURCE(J);
End loop;

In here, through the formula of (1) and (2), column No. C is acts on an offset and due to the inter-column substitution, DIFF_COL_IDX is added. DIFF_COL_IDX is acquired through [formula 2]

[Formula 2]

$$DIFF\_COL\_IDX=REAL\_COL\_IDX-(PRE\_COL\_IDX+1);$$

In here, PRE_COL_IDX denotes an index of a post-recorded column and REAL_COL_IDX denotes a index of post inter-column substitution column. That is, in the [Table 1], if TTI is 40 ms, the column number is being 4 and after the inter-column substitution, the column sequence is being 0−>2−>1 −>3. So, after a first column 0 is inputted, then the column 2 is inputted instead of the column 1. At this time, DIFF_COL_IDX is being "2−(0+1)=1". In this way, a symbol index relationship before interleaving and after interleaving is understood.

If an effective address generator is used in an IMT-2000 through the present invention, a required memory is decreased about 40%. Because, if a first interleaver and a deinterleaver memory size are support a 80 ms TTI, it could have an absolute size than other memories.

The following [Table 2] is a comparative table between conventional and the presented method in a memory size referring to a 3G TS 25.101 standard document, a data rate is 384 kbps, TTI is 80 ms.

TABLE 2

|  | Conventional structure | Presented structure | Note |
|---|---|---|---|
| First interleaver | 185,820 bit | 92,640 bit | 50% |
| Second interleaver | 19,200 bit | 11,520, bit | 40% |
| First deinterleaver | 1,013,600 bit | 633,500 bit | 37.5% |
| Second deinterleaver | 127,680 bit | 65,968 bit | 48% |
| total | 1,345,760 bit | 803,628 bit | 40% |

As can be known in [Table 2], by downsizing the memory size that is required in the first deinterleaver in the IMT-2000, a modem in terminal obtaining one chip and the base can accept more channels in one chip.

Figure 3:
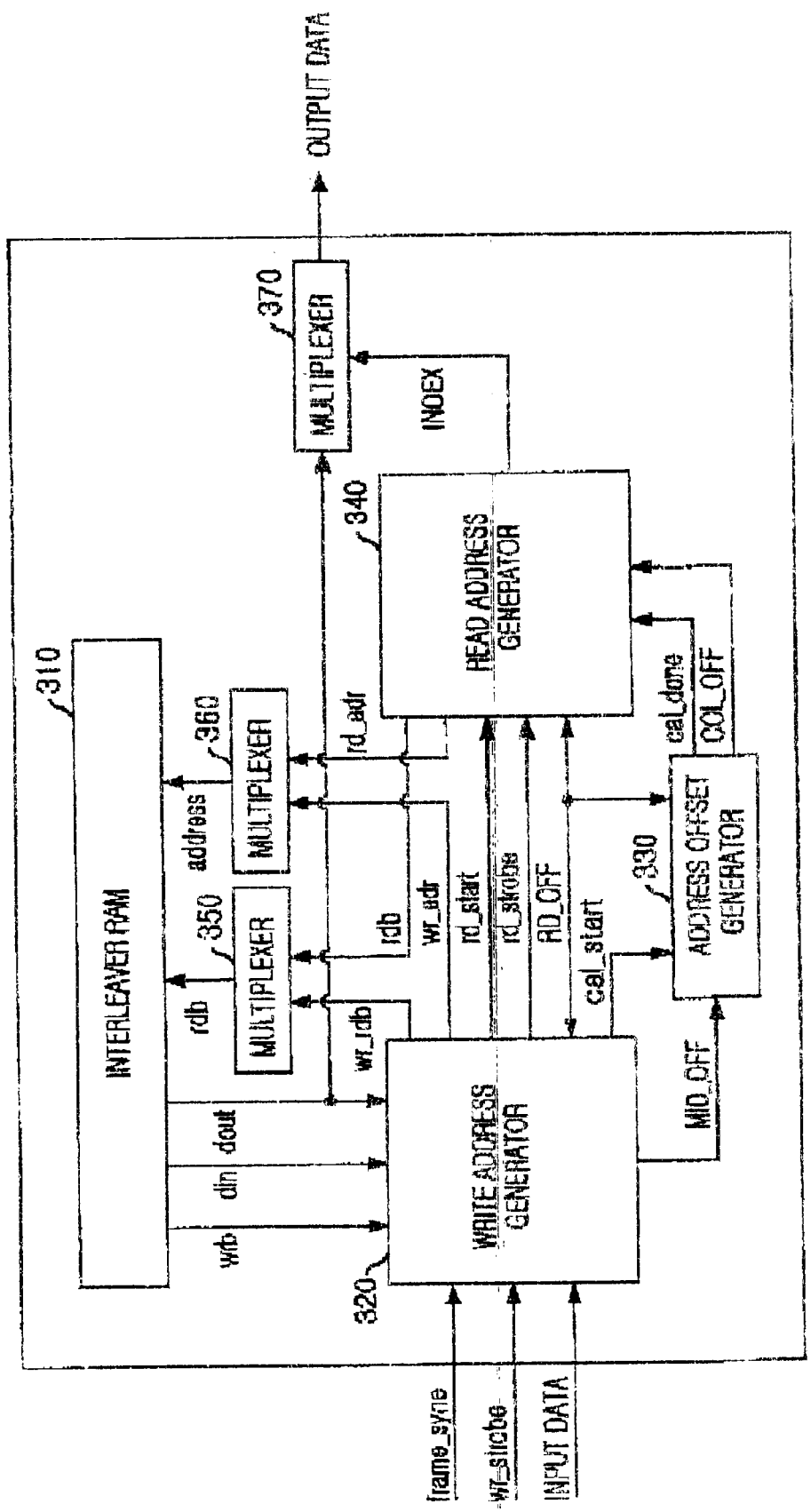
FIG. 3 is a diagram showing an interleaving performing device among the address generator included interleaving/deinterleaving performing device in accordance with the present invention.

FIG. 3 is a diagram showing an interleaving performing device among the address generator included the interleaving/deinterleaving performing devices.

As described in FIG. 3, the inter-column substitution included block interleaving performing device includes an interleaver RAM 310 for storing a sequence, a writing address generator 320 for demanding a memory inter-location needed WR_OFF to performing a writing operation in an interleaver RAM 310 memory block and for generating practically writing address, data and a memory control signal, an address offset generator 330 for inputting a MID_OFF and a cal_start for demanding a memory inter-location RD_OFF from the writing address generator 320, to read in an interleaving sequence and for generating a COL_OFF which is used for the RD_OFF and inter-column substitution respectively; a reading address generator 340 for increasing the address offset generator 330 originated signal to as much as the RD_OFF and create an address for reading an interleaver RAM 310 to generate a memory control signal; the first and the second multiplex device 350, 360 for selecting an appropriate signal between a control signal and an address in the writing address generate 320 and the reading address generator 340 transferred writing operation needed reading operation, and in a real interleaving operation needed reading operation; and a multiplex device 370 for selecting an appropriate symbol in the memory output signals which are generated from the reading operation, and performed from the interleaving which is transferred from the reading address generator 340.

A detailed illustration of the above devices is as follow.

Figure 4A:
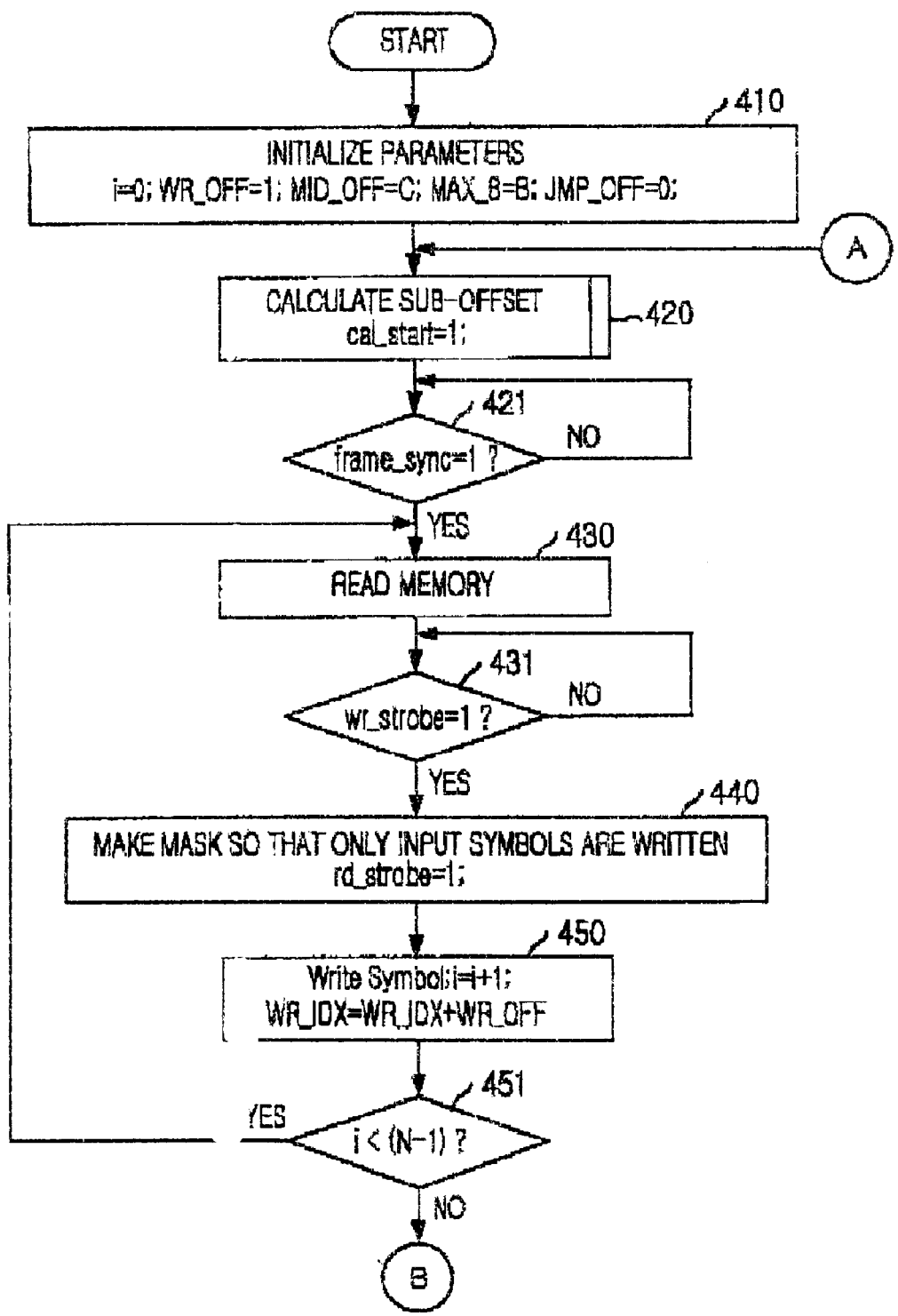

First of all, the reading address generator 320 is a block which is operated in after described FIG. 4a and FIG. 4b, thereby need an register collection by storing a currently inputted frame information inputted by a microprocessor or other outside interface. In this register collection initializing a medium variable after record a frame size, number of the column, and TTI, then transfer the MID_OFF and the cal-start signal to the address offset generator 330 for obtain the RD_OFF and the COL_OFF. And to input a frame_sync signal and record a first symbol, read a corresponding address "0" from the interleaver RAM 310. At this time, the multiplex device 350, 360 select a memory control signal wr_rdb and a wr_adr, and after confirm the interleaver RAM 310 read data and the wr_strobe, for cover a mask which is made by inputted signal and only cover the corresponding symbol performing disjunction and conjunction according to the inputted signal, then records it to the interleaver RAM 310 again. In the writing address generator 320 this operation is happening repeatedly so, generate an interleaving performing signal rd_start after recording one frame to the read address generator 340. The address offset generator 330 is a block which performing the same operation described in FIG. 5, and as described before, it receives the MID_OFF, and if the value is bigger or same as N, then accept the "modulo" operation to make the RD_OFF, if the value is smaller than N, then the MID_OFF is same as the RD_OFF. After acquired the RD_OFF then, acquire the COL_OFF for the inter-column substitution. When acquired the RD_OFF and the COL_OFF all, then transfer a cal_done signal to the reading address generator 340 for carry over a corresponding value.

Figure 6:
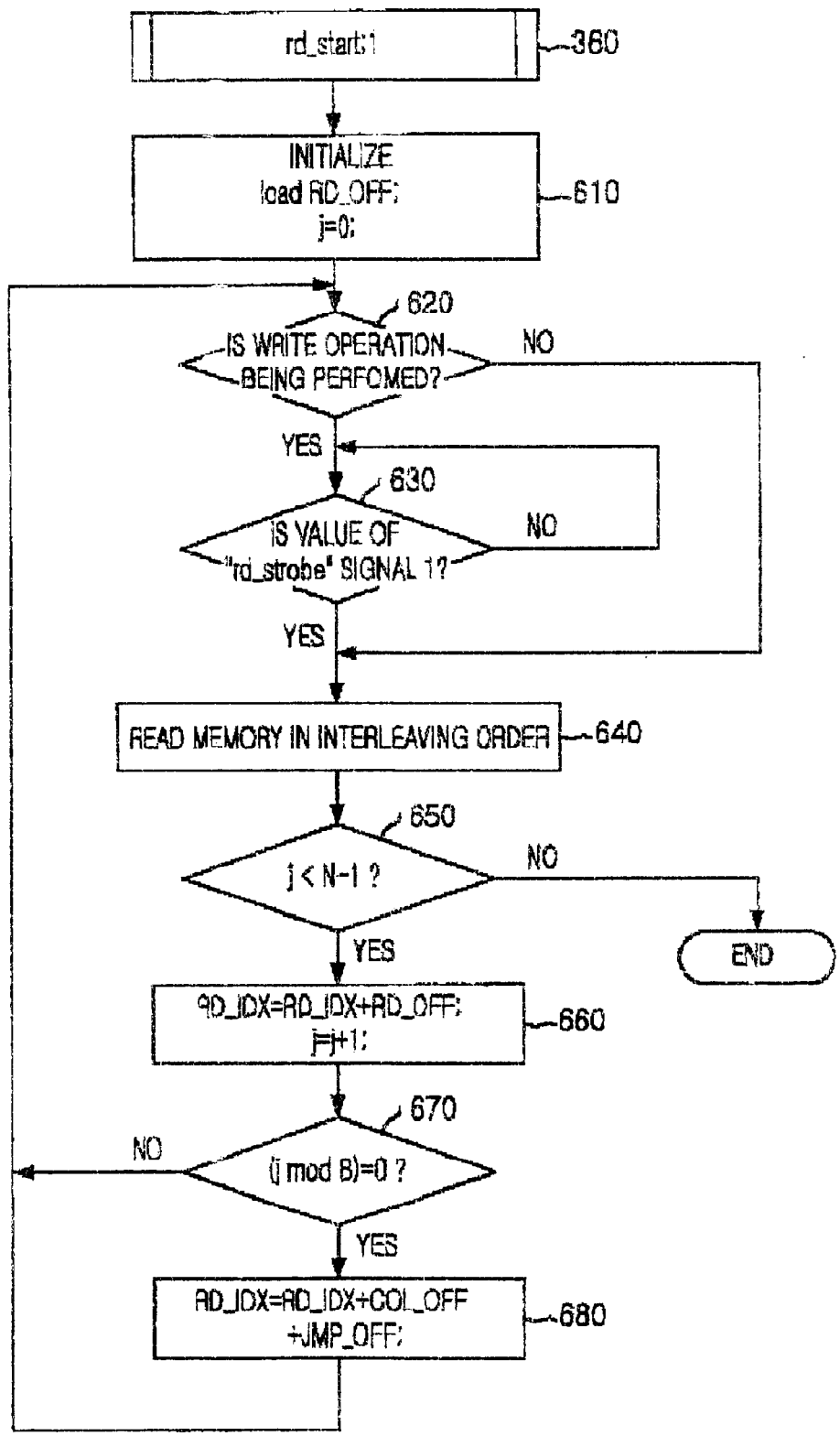
FIG. 6 is a flow chart showing an interleaving used reading address generating method among the interleaving/deinterleaving performing method in accordance with the present invention.

The reading address generator 340 is a block that carried out an operation described in FIG. 6. After accept the rd_start from the writing address generator 320 then, transferred the RD_OFF and the COL_OFF and read the memory for interleaving. As described above, it increase a RD_IDX as much as the RD_OFF by linear, carry out the interleaving by read a deinterleaver memory, but in case of a column change the COL_OFF has to be added for the inter-column substitution, and when a data rate is decreased, add a JMP_OFF in the RD_IDX to skip an unused region. In this reading operation mode, through the multiplex device 350, 360, choose a memory control signal rd_rdb and a rd_adr. If a writing operation and a reading operation is carried out at the same time, then the reading operation has to check the rd_strobe signal before carry out the operation.

The specific operation of the writing address generator 320, the address offset generator 330 and the reading address generator 340 will be described in FIG. 4a, FIG. 4b and FIG. 6.

The interleaving performing device using only one memory different from the conventional two-memory structure and can carry out a simple block interleaving and an inter-column substitution pre-operated block interleaving.

FIGS. 4a and 4b are flow chart showing an interleaving used writing address generating method among the interleaving/deinterleaving performing methods in accordance with the present invention.

In here, first frame's using is described. As described in FIGS. 4a and 4b, first, 5 medium variables are initialized 410. When a first frame is written, it can write in any location cause the interleaver RAM 310 is stuffed by an useless data. As described above, if call a memory inter-location offset which write a successively inputted two symbols to the interleaver RAM 310 as a WR_OFF, a first frame's WR_OFF could have a random value, but initialize it to "1" as shown in 410 processing.

Then, an "i" which is a medium variable for account an inputted symbol number is initialized to "0". Using a MID_OFF, a MAX_B and a JMP_OFF to calculate a Sub_offset and described the cal_start to 1, the RD_OFF and the COL_OFF are obtained. They will be described in FIG. 5, in a reading operation.

When a medium value is initialized, check whether the frame_sync signal of a first frame's is 1 or not 421, then repeat the frame_sync signal until the signal is 1. If the frame_sync signal is 1, then read a corresponding memory 430.

In here, the frame_sync signal is a kind of synchronous signal, showing one frame's data is inputted for the interleaving. Basically, it using only one memory so, firstly read currently inputted symbol's writing position, and covers the position by a currently inputted symbol. For this, reading the corresponding memory 430 and check whether a wr_strobe signal is 1 or not 431, if it is not 1, wait for the wr_strobe signal is 1, and if it is 1, then made a mask for cover only the inputted symbol. That is, the mask is made for only cover the writing position data of the inputted symbol.

In here, the wr_strobe signal is a control signal for showing an input symbol is effective or not. And in the mask, a input symbol is "0", then only made the position to 0(the other is 1) and carried out conjunction with the 430 process reading data, and if the input symbol is 1, then only made the position to 1 (the other is 1) and carried out disjunction with the 430 process reading data.

At this time, two things are considered. One is using a Dual Port RAM in the memory, and the other is using a Single Port RAM in the memory, consideration between reading and writing operation relationship. When using Dual Port RAM, reading and writing is operated respectively, so can control easily and obtain bigger timing margin, but size and energy consumption is increased. So, if it has enough timing, then using the Single Port RAM is more effective. And when a memory reading operation and writing operation can divide, the Single Port RAM is better.

Second case is undivided the memory reading operation and the writing operation, and it is essential in a second interleaver. Because a modulator transferred timing, when it has a transferred data, it has to be happened in the whole area in regulate, so cannot read a data of the ex-frame quickly. That is, during the reading operation performing for the ex-frame interleaving, a next frame's data is inputted, the management problem. Generally, an internally carried out operation is more speedy, but if the reading and writing operation speed is same, then the two operation have to be carried out in turn. In this case, when using the Dual Port RAM or the Single Port RAM by processing timing, a divided control is needed for the writing and the reading operation in turn.

The FIGS. 4a and 4b are considered that operation. So when a mask making processing 440 for only cover an inputted symbol, the rd_strobe "1" means the reading operation is possible. Finally, read a corresponding address once for carrying out a writing operation during a reading process 430 of corresponding memory, make a mask for writing only 440 process inputted symbol and at the same time carry out a reading process for a real interleaving, in 450 process carry out disjunction or conjunction between the mask and the 430 process read data for write the result in memory, then increase a WR_IDX as much as a WR_OFF. In case of "i" is smaller than N−1, then carry out the 430 process again, and "i" is bigger or same as N−1, it will be described in a second frame medium variable obtaining process.

The first frame writing needed medium variable formula is as below.

Initial value:

WR_OFF<=1;
WR_IDX<=0;
Computed value:
For I in 0 to (N−1) loop
If I=0 then
   WR_IDX<=0;
else
   WR_IDX<=WR_IDX+WR_OFF;
end if;
if WR_IDX≧N then
   WR_IDX<=WR_IDX−(N−1);
end if;
end loop;

Meanwhile, an implement of a first frame writing is as same as a 740 processes in FIG. 7. In here, a "src index" denotes a source data 720 and a "mem index" denotes an index of the interleaver RAM 310. Supposing data width of the interleaver RAM 310 as 8 bit, lower 3 rank of the "mem index" is being an index for choosing one bit among the 8 bits, and the rest is being an address of the real memory. The WR_IDX is 1, and then the WR_IDX increases as much as 1 in linear and records inputted source symbol to the interleaver Ram 310.

Now examine how a medium variable for a first frame is obtained and how the first frame is reading.

First, a medium variable for a reading operation is initialized as following. The MID_OFF which is initialized in the 410 process of FIGS. 4a and 4b are values for obtaining the RD_OFF which denotes a successively readable two symbol's memory inter-location offset and in some cases it obtain the "modulo" operation to being the RD_OFF. However in a practical way, the WR_OFF and multiple of column number "C" can illustrate them. When an initial value of the WR_OFF is 1, then the MID_OFF is being C and cause of it is smaller than N, then this value is being the RD_OFF. In case of TTI is 10 ms, the interleaving is not carried out as shown in [Table 1], so the MID_OFF is being 1. A MAX_B and a JMP_OFF are variables for considering data rate changing and their initial values are 0 and are renewed in frame unit. A value of the MAX_B is renewed comparing to a value of B to a bigger value, and when the value of B is changed from bigger to smaller, that is, when a data rate is decreased, there happening an unused region and the JMP_OFF make it possible to skip this area in the reading operation performing. Therefore, in the 420 processes, there performing two operations and the flow chart will be described in FIG. 5.

First, check the MID_OFF is smaller than a frame symbol number N 510 and if the MID_OFF is bigger or same as N, then take the "modulo" calculation to obtain the RD_OFF and if the MID_OFF is smaller than N, the MID_OFF is being the RD_OFF.

The formula is as below.
MID_OFF<=WR_OFF×C;
If MID_OFF<N then
   RD_OFF<=MID_OFF;
Else
   RD_OFF<=MID_OFF mod (N−1);
Else if;
Second, calculate the COL_OFF, and it need for carrying out the inter-column substitution.

$$COL\_OFF<=DIFF\_COL\_IDX \times WR\_OFF; \qquad (3)$$

If COL_OFF≧N then $$COL\_OFF<=COL\_OFF \bmod (N-1) \qquad (4)$$

End if;

Then determine 540 whether carry out the inter-column substitution as in [Table 1] TTI is 10 ms or 20 ms, and if not carry out, then the COL_OFF is being 0 550, and if carry out the inter-column substitution then obtain the COL_OFF as described in the Formula 3 or 560 processing. At this time, check whether the COL_OFF value is bigger than N 570, and if it is bigger or same, then take the "modulo" calculation as in Table 4 or 580 processing.

Figure 5:
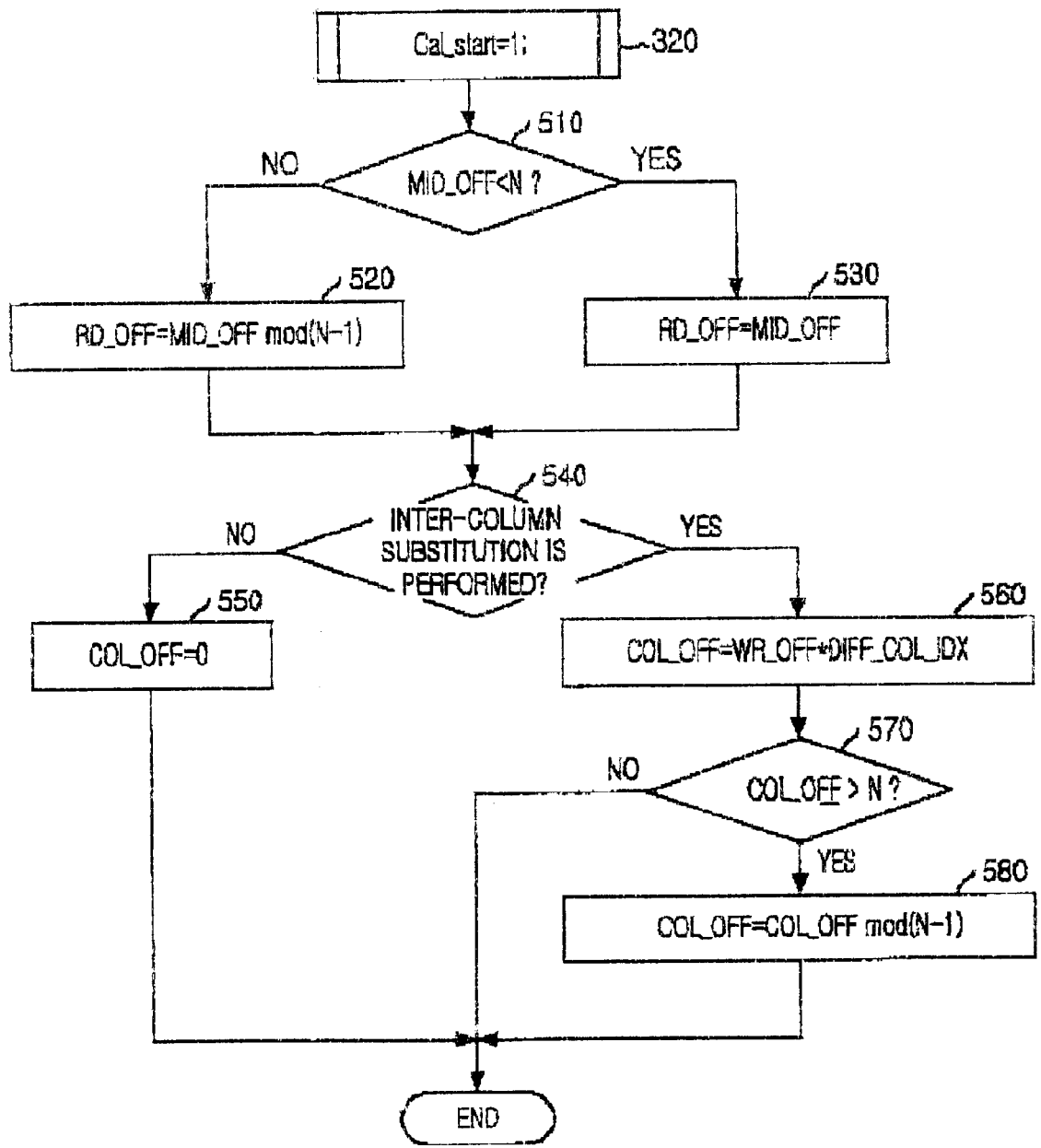
FIG. 5 is a flow chart showing an interleaving used offset generating method among the interleaving/deinterleaving performing methods in accordance with the present invention.

The RD_OFF and the COL_OFF of FIG. 5 have no connection with frame writing and used in the reading operation, so before an inputted frame data writing the calculation of FIG. 5 doesn't need to be ended. That is, the frame data writing operation and the RD_OFF and the COL_OFF obtaining operation can be carried out in parallel. The formula is as below.

Initial value:

$$JMP\_OFF<=0; \quad (5)$$

$$MID\_OFF<=C; \quad (6)$$

Computed value:

$$RD\_OFF<=MID\_OFF; \quad (7)$$

$$COL\_OFF<=WR\_OFF \times DIFF\_COL\_IDX; \quad (8)$$

FIG. 6 describes a reading method of the written symbol of FIG. 4a, FIG. 4b and FIG. 5 to the interleaving sequence. In FIG. 6, the rd_start generating process 460 of FIGS. 4a and 4b are described. The RD_OFF of FIG. 5 is latched in 610 processing then initializes j to 0 for calculating an interleaving symbol number. In this case, the Single Port RAM is used, a reading and a writing operation happen simultaneously, and priority ranking is in the writing operation. After this, check whether the writing operation is in performing or not 620, and the reading operation is in performing, then read memory in an interleaving sequence 640, and if the writing operation is performing, check whether a rd_strobe signal is 1 or not, and if it isn't 1, waiting until the rd_strobe signal is being 1, and if it is 1, then read memory in the interleaving sequence 640. After this, compare j and N−1 for checking the entire frame corresponded symbols are read in the interleaving sequence.

In case of j is smaller than N−1, that is, symbols for performing the interleaving are remained, so increase 660 a RD_IDX to a RD_OFF, J to 1 for reading a next symbol, then take the "modulo" calculation for checking whether j is changed to B−1 or not. And the checking result is 0, and then increase the RD_IDX as much as a COL_OFF 680. The a JMP_OFF is an initial value 0 cause it is a first frame. In the next step checking whether the current writing operation is performing or not 620, and the result value is not 0, then go to the writing operation checking process 620.

The RD_IDX formula can be described as below.
for j in 0 to (N−1) loop
  if j=0 then
    RD_IDX<=0;
  elsif (j mod B)/=0 then
    RD_IDX<=RD_IDX+RD_OFF;
  else
    RD_IDX<=RD_IDX+RD_OFF+COL_OFF+JMP_OFF;
  end if;
  if RD_IDX≧N then
    RD_IDX<=RD_IDX−(N−1);
  end if;
end loop;

Now examine how a medium variable for a second frame is obtained and how the second frame is written.

When the first frame is recorded, then a rd_start to 1 which means permitting in the 460 process, the reading operation can be performed, then waiting for inputting of information for the second frame in the 470 process.

After receives information for the second frame, redefine the medium variable for the second frame, and the RD_OFF of the first frame is being the WR_OFF of the second frame 471. The medium variable for reading the second frame is obtained after the 471 processes. After that, obtaining the needed medium variable for read the second frame, and it will be described in the reading operation of the second frame.

After obtain the medium variable for the second frame, in the 421 processes, waiting for the frame_sync signal of denoting a start of a next frame. The formula of the medium variable for the second frame and the WR_IDX calculation is as below.

$$WR\_OFF<=RD\_OFF; \quad (9)$$

For i in 0 to (N−1) loop
  if i=0 then
    WR_IDX<=0;
  else
    WR_IDX<=WR_IDX+WR_OFF;
  end if;
  if WR_IDX≧N then
    WR_IDX<=WR_IDX−(N−1)
  end if;
end loop;

Now examine how the medium variable for the second frame is calculated. First, check changes of a data rate (MAX_B>B) 480 and if there's no change or increase, the MAX_B is reformed to one of the next frame included symbol number B, and a JUP_OFF=0 782, if decrease, the MAX_B has no change and obtain the JMP_OFF 481. At this time, comparing the JMP_OFF and N 490, and if the JMP_OFF is bigger than N, then performing the "modulo" operation 492, and obtain the MID_OFF for calculating the RD_OFF and the COL_OFF of the next frame, the value is same as the next frame the WR_OFF times column number C 491.

The formula of the medium variable for the second frame is as below.
if MAX_B>B then
  JMP_OFF<=(MAX$_{B-B)\times WR}$_OFF;
  if JMP_OFF>(N−1) then
    JMP_OFF<=JMP_OFF mod (N−1);
  end if;
else
  MAX_B<=B;
  JMP_OFF<=0;
end if;

$$MID\_OFF<=WR\_OFF \times C; \quad (10)$$

if MID_OFF<N then $$RD\_OFF<=MID\_OFF; \quad (11)$$

else $$RD\_OFF<=MID\_OFF \bmod (N-1); \quad (12)$$

end if;

At this time, the formula (10) can be denoted to MID_OFF=RD_OFF×C because of in the formula (9) WR_OFF=RD_OFF. The formula (10) and (11) can be obtained through 420 process in FIG. 5. After obtaining a variable for the frame, waiting for a signal the rd_start which means the next frame interleaving is possible. In FIGS. 4a and 4b, reading the second frame after the rd_start is as same as reading the first frame.

for j in 0 to (N−1) loop
  if j=0 then

```
RD_IDX<=0;
elsif (j mod B)/=0 then
    RD_IDX<=RD_IDX+RD_OFF;
else
    RD_IDX<=RD_IDX+RD_OFF+COL_OFF+JUP_
       OFF;
end if;
if RD_IDX≧N then
    RD_IDX<=RD_IDX (N−1);
end if;
end loop;
```

That is, in FIG. 7, after written the first frame, then performing the interleaving, obtaining the medium variable value for the second frame, the second frame is written by using the value, and performing the interleaving again.

As described in FIG. 7, after the first frame is written in the interleaver RAM 310, 740, the frame is written for performing the interleaving as in 770 processes. In here, a DOUT INDEX means an interleaved result index, and a COL_OFF is added in case of a column change for the inter-column substitution. The number of symbols in each column is 6, so if the DOUT INDEX is changed from 5 to 6, then a DIFF_COL_IDX is 2−(0+1)=1, and the COL_OFF is 1*1=1 as described in 710 process. Therefore, the RD_IDX is being 20+4+1=25, so delete N−1 cause this value is bigger than N−1. Also, if the DOUT INDEX is changed from 11 to 12, then the DIFF_COL_IDX is 1−(2+1)=−2, and the COL_OFF is 1*−2=−2. Therefore, the RD_IDX is being 22+4+−2=24, so delete N−1 cause this value is bigger than N−1. In this way, performing the first frame interleaving. In the 770 process, there described obtaining a WR_OFF and a WR_IDX for writing the second frame. Firstly, the RD_OFF value of the first frame is being the WR_OFF of the second frame. Therefore, the WR_IDX is increased in linear by the WR_OFF, 4, and the symbol of inputted second frame is written in a corresponding address of an interleaver memory. The result is described in 780 processes. Now examine by 790 processes how the second frame is read for performing the interleaving. According to the 491 process of FIGS. 4a and 4b, the MID_OFF is obtained firstly for obtain the RD_OFF, the MID_OFF is calculated by the WR_OFF or the RD_OFF in the first frame doubled the column number C, so being 4*4=16, and the value is smaller than N, it directly being the RD_OFF by the 530 process in FIG. 5.

Like the reading operation in the first frame, when they are included in a same column, the RD_IDX is increased in linear by the RD_OFF 16, and in case of the column changing, for example the DOUT INDEX is changed 5 to 6, the DIFF_COL_IDX is 1, and the COL_OFF is 4 like the WR_OFF. Therefore, when the DOUT INDEX is 6, a symbol of the RD_IDX is 11+16+4=31, and because of this value is bigger than N−1, it being 31 −23=8. By this way, the second frame interleaving is performed.

Figure 8:
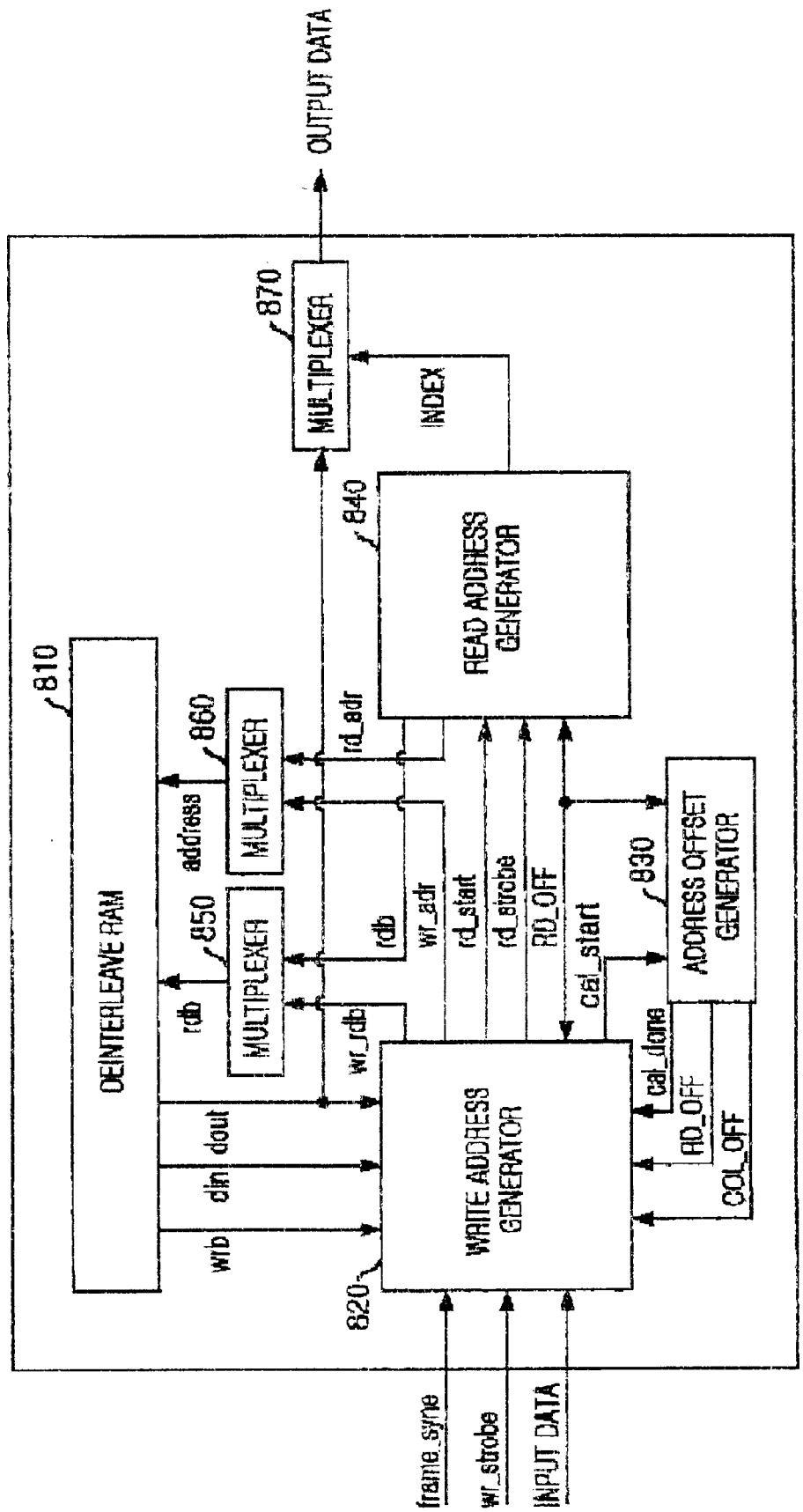
FIG. 8 is a diagram showing a deinterleaving performing method among the interleaving/deinterleaving performing method in accordance with the present invention.

FIG. 8 is a diagram showing a deinterleaving performing method among the interleaving/deinterleaving performing method in accordance with the present invention, for performing the deinterleaving the inter-column substitution included block interleaving. As described in FIG. 8, the deinterleaving device of the inter-column substitution included block-interleaving including an deinterleaver RAM 810 for storing inputted frame symbol, a writing address generator 820 for demanding a memory inter-location needed WR_OFF to performing writing operation in the interleaver RAM 810 memory block and for generating practically written address, data and a memory control signal, an address offset generator 830 for inputting a MID_OFF and a cal_start for demanding a memory inter-location RD_OFF from the writing address generator 820, to reading in a deinterleaving sequence and for generating a COL_OFF which is used for a RD_OFF and the inter-column substitution respectively, a reading address generator 840 for increasing the writing address generator 820 originated signal to as much as the RD_OFF and create an address for reading the deinterleaver RAM 810 to generate the memory control signal, the first and the second multiplex device 850, 860 for selecting a control signal and an address in the writing address generate 820 and the reading address generator 840 transferred writing operation needed reading operation, and in a real interleaving operation needed reading operation; and a multiplex device 870 for selecting appropriate symbols among the memory outputs which are generated from the reading operation, and performed from the reading address generator 840 transferred deinterleaving.

A detailed illustration of the above devices is as follow.

Figure 9A:
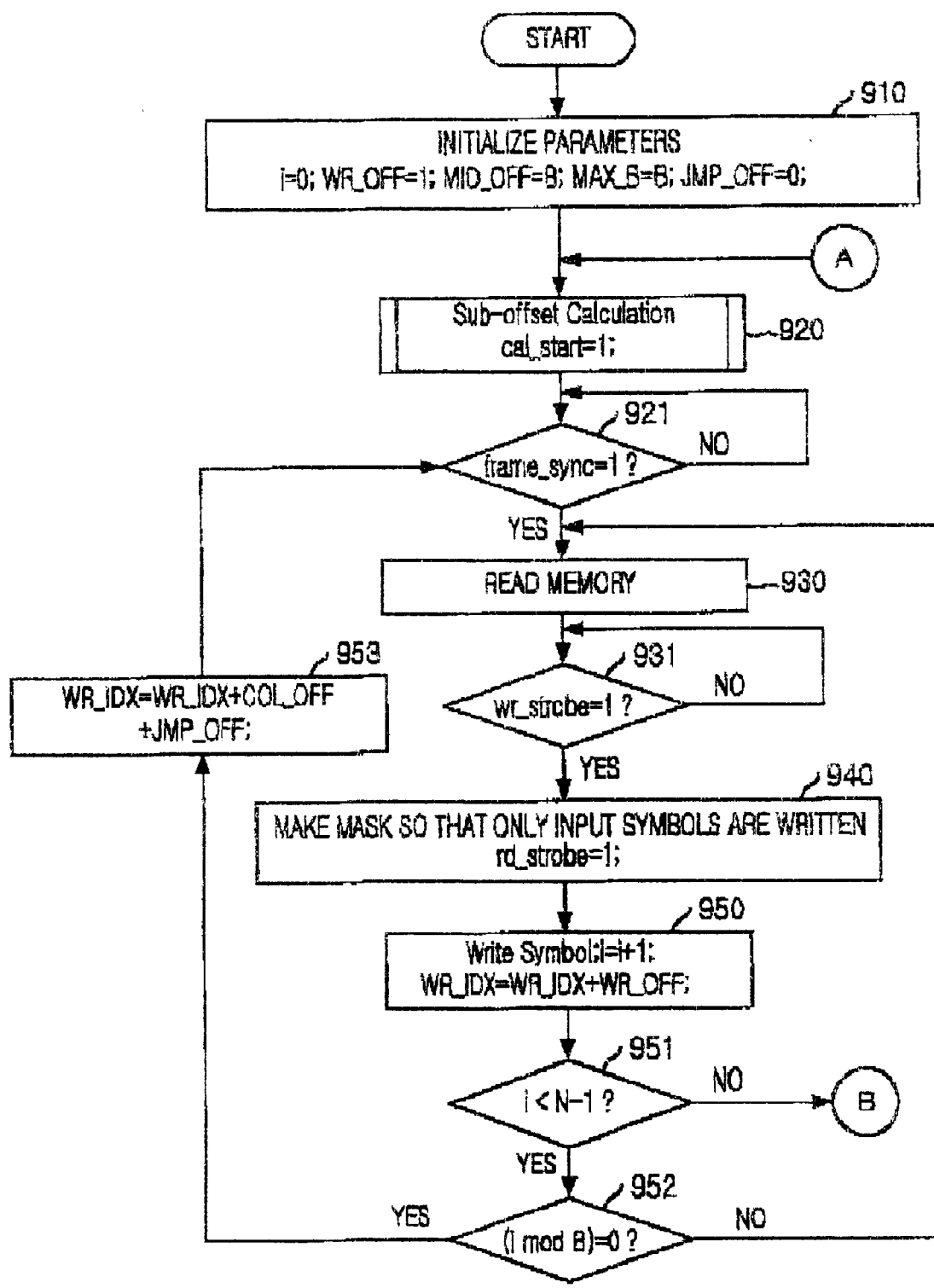

First of all, the reading address generator 820 is a block which is operated in an after described FIGS. 9a and 9b, thereby needed an register collection by storing a currently inputted frame information inputted by a microprocessor or other outside interfaces. In this register collection initializing a medium variable after records a frame size, a number of column, and TTI, then transfer the MID_OFF and a cal-start signal to address the offset generator 830 for obtaining the RD_OFF and the COL_OFF. And to input a frame_sync signal and record first symbol, read a corresponding address "0" from the deinterleaver RAM 810. At this time, the multiplex devices 850, 860 select memory control signal wr_rdb and wr_adr, and after confirm the deinterleaver RAM 810 read data and the wr_strobe, for covering a mask, made by an inputted signal, to only the corresponding symbol, according to the inputted signal performing disjunction, conjunction, then record to the deinterleaver RAM 810 again. In the writing address generator 820 this operation is happening repeatedly and performing the inter-column substitution restore process by inputting the COL_OFF from the address offset generator 830, after record one frame, then the read address generator 840 generate an interleaving performing signal rd_start and the RD_OFF from the address offset generator 830.

Figure 10:
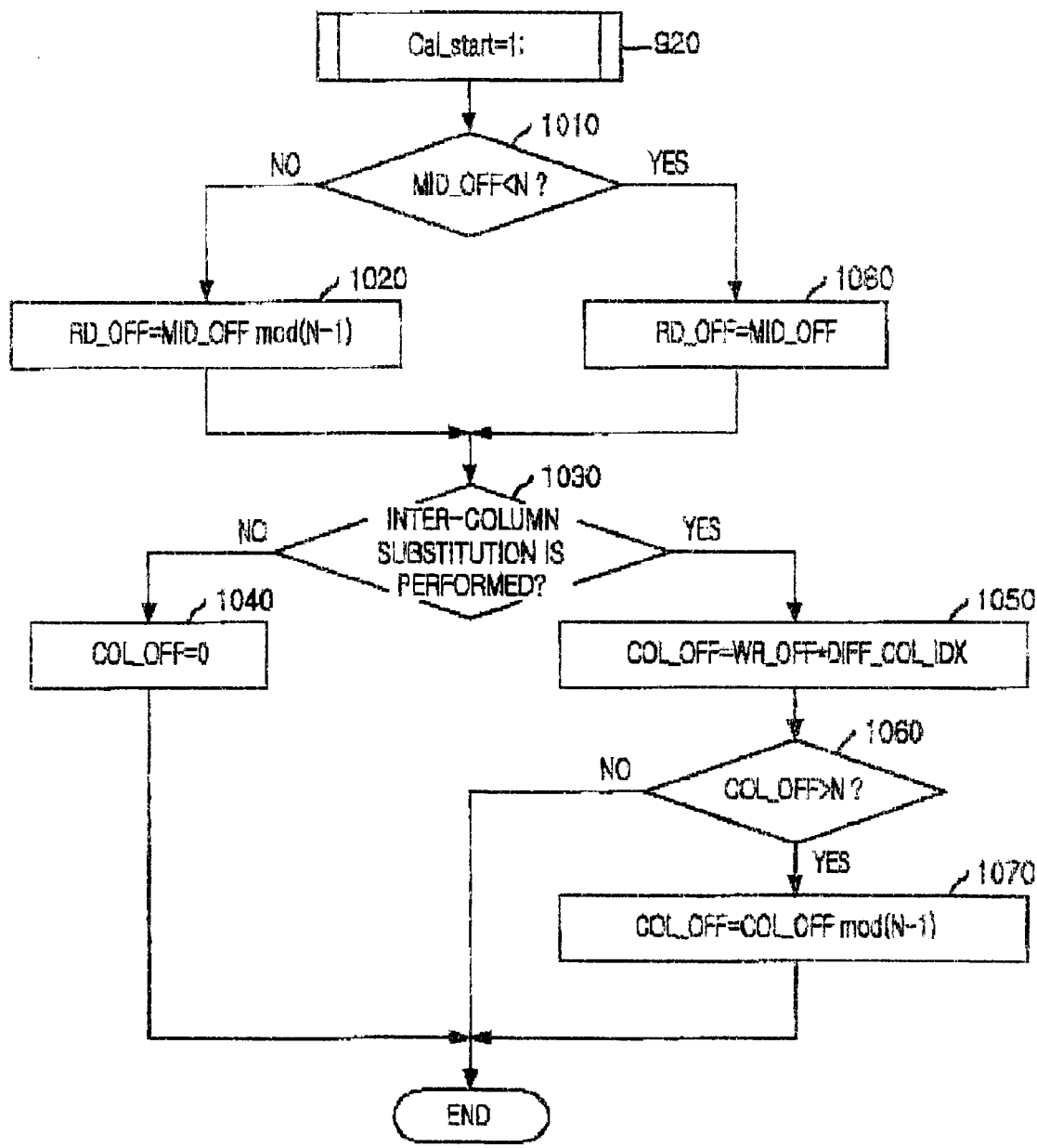
FIG. 10 is a flow chart showing an interleaving used offset generating method among the interleaving/deinterleaving performing methods in accordance with the present invention.

The address offset generator 830 is a block, which making the RD_OFF and the COL_OFF and performing the same operation described in FIG. 10. And as described above, it receives the MID_OFF and if the value is bigger or same as N, then accept the "modulo" operation to make the RD_OFF, if the value is smaller than N, then the MID_OFF is same as the RD_OFF. The RD_OFF is acquired, and then acquire the COL_OFF for the inter-column substitution restore. When acquire the RD_OFF and the COL_OFF all, then transfer a cal_done signal to the writing address generator 820 for carry over the corresponding value.

Figure 11:
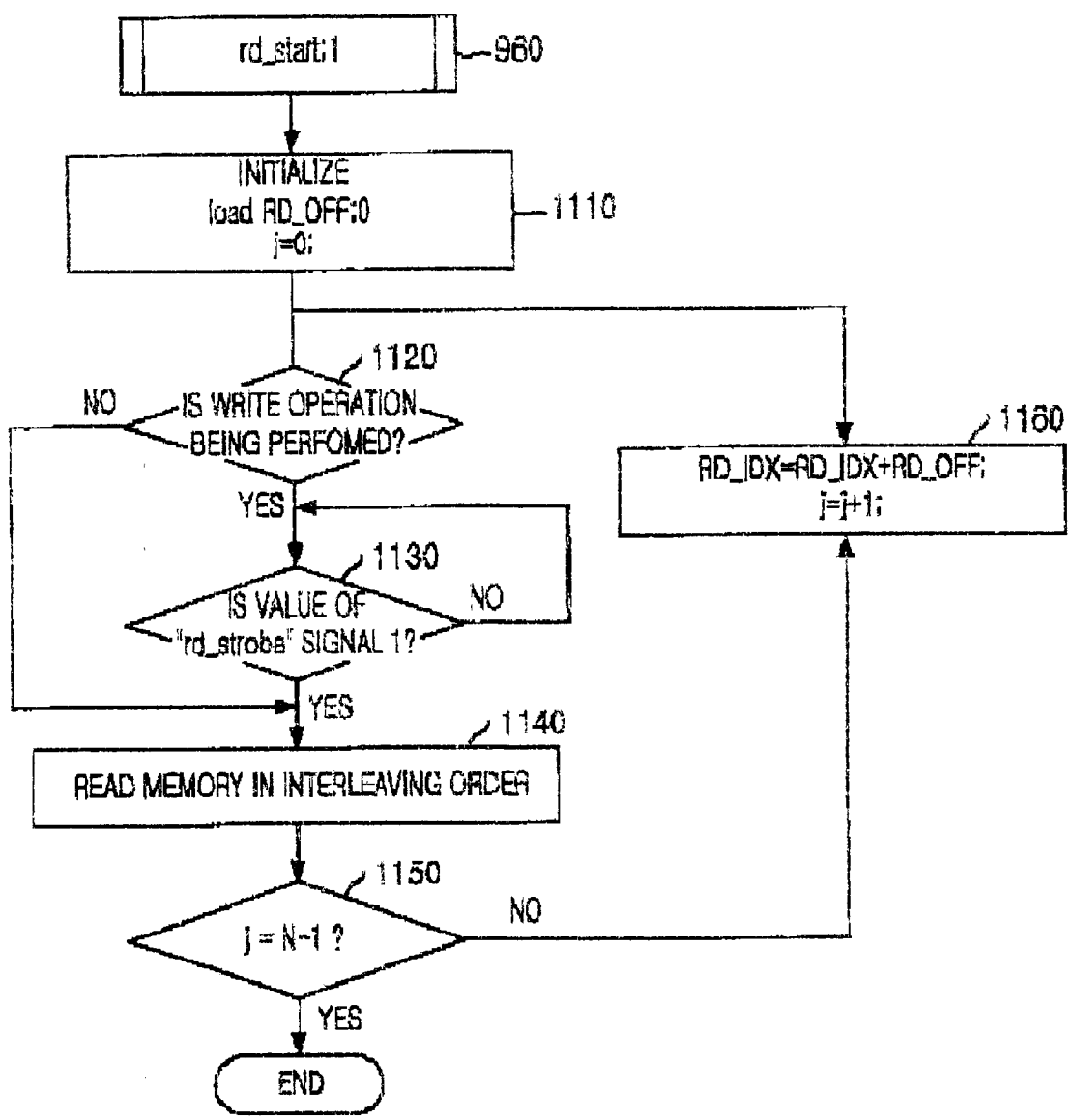
FIG. 11 is a flow chart showing an interleaving used reading address generating method among the interleaving/deinterleaving performing methods in accordance with the present invention.

The reading address generator 840 is a block which increasing a signal from the address offset generator 830 as much as the RD_OFF, make an address for reading the deinterleaving RAM 810 and generating the memory control signal, carrying out an operation described in FIG. 11. After accepting the rd_start, the RD_OFF value and the MID_OFF from the writing address generator 820, then the memory reading operation is started. As described above, it increases the RD_IDX as much as the RD_OFF by linear, carry out the deinterleaving by reading the deinterleaver RAM 810. In this reading operation mode, through the multiplex devices 350 and 360, choose the memory control signal the rd_rdb and the rd_adr. If a writing operation and the reading operation is carried out at the same time, then the reading operation has to check the rd_strobe signal before carry out the operation.

Figure 13A:
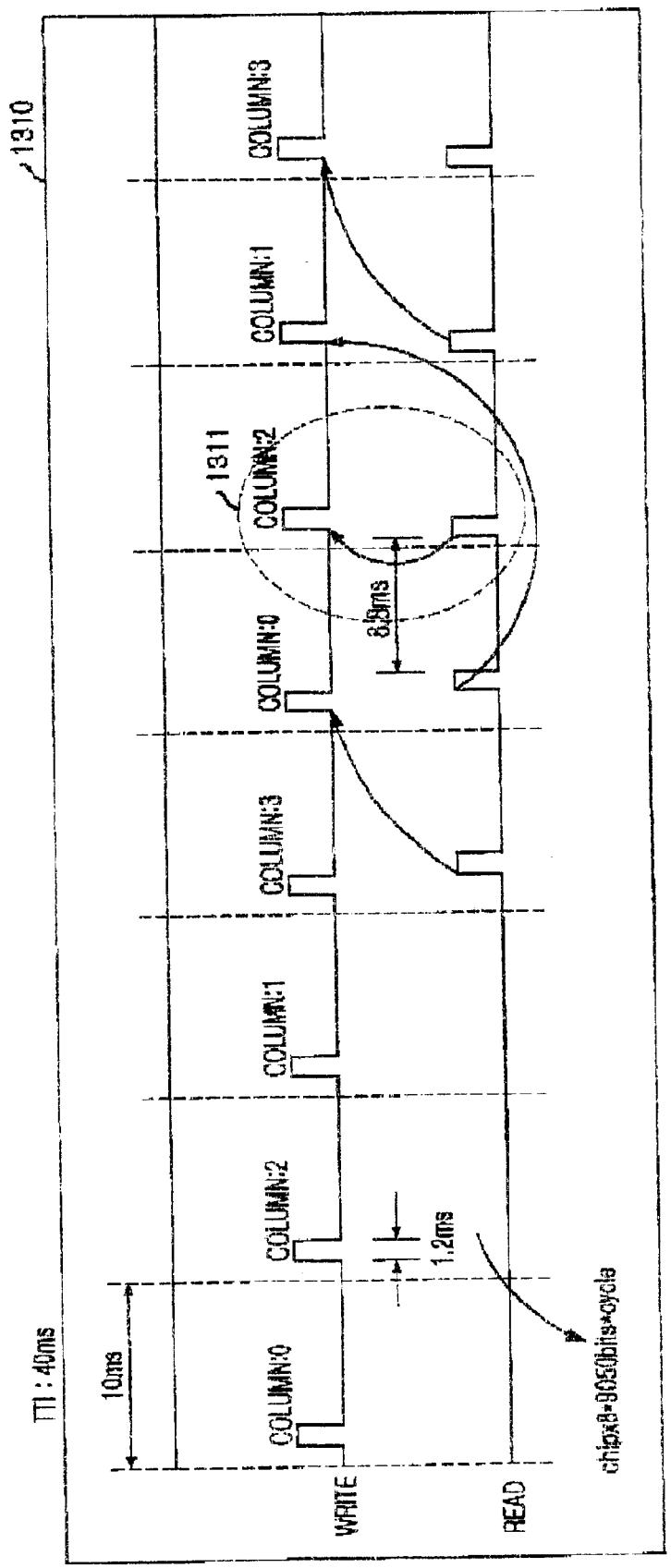
FIG. 13 is a timing diagram showing an interleaving performing used reading/writing operation among the interleaving/deinterleaving performing methods in accordance with the present invention.
Figure 13B:
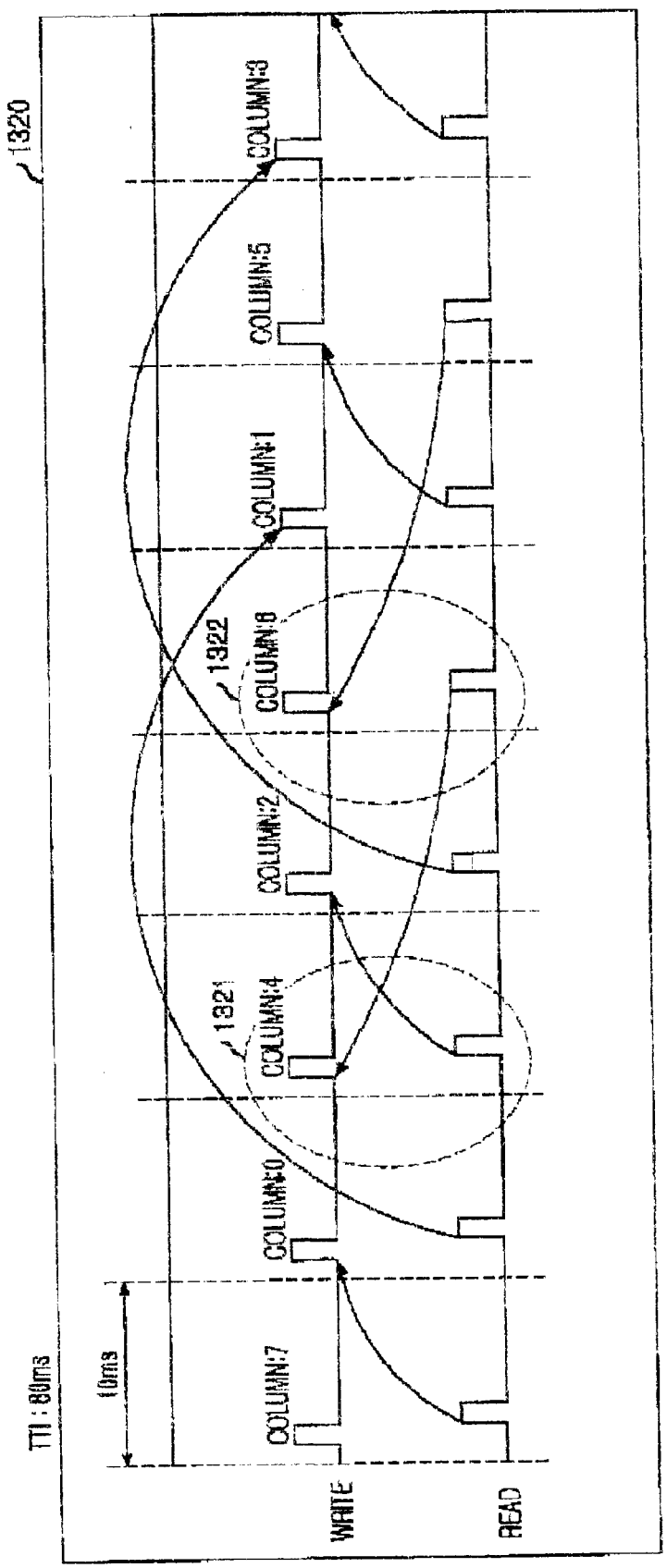

In this case, by recording in original sequence for restoring the inter-column substitution, a regulation is provided, but when TTI is 40 ms or 80 ms, a timing control is followed as in FIGS. 13a and 13b.

As described in FIG. 13a, when TTI is 40 ms 1310, a column is 4 and an input symbol is inputted in 10 ms unit by burst. The deinterleaving process is started after record 4 columns in the deinterleaver RAM 810, in 1311 process, a reading position and a writing position can be folded. For the folding position, the added RAM 810 is required.

And as described in FIG. 13b, when TTI is 80 ms 1320, for supporting 80 ms, there need two more memories because in 1321 and 1322 processes an inputted symbol is recorded before reading and it lost a corresponding symbol.

Therefore, the memory can be selected in 1321 and 1322 corresponding timing, by fitting addressing. Of course, in this case by using the two more memories, increase a proper offset and make one memory and other added memory for read or write by the selecting signal.

The above deinterleaving performing device can decrease about 37.5% of the first deinterleaver RAM and 40% of deinterleaver.

Meanwhile, in FIGS. 9a and 9b to FIG. 11, there is described how the inter-column substitution is performed and block interleaved inputted symbols are written in the deinterleaver memory and performing the deinterleaving.

FIGS. 9a and 9b are flow chart showing an interleaving used writing address generating method among the interleaving/deinterleaving performing method in accordance with the present invention, and examine how the first frame is written and read.

As described in FIGS. 9a and 9b, first, 5 medium variables are initialized 910. When the first frame is written, it can write in any location cause the deinterleaver RAM 810 is stuffed by an useless data. As described above, if call a memory inter-location offset which write a successively inputted two symbols to a interleaver RAM 910 as a WR_OFF, a first frame's WR_OFF could have a random value, but initialize it to "1" as shown in 910 processing. A MID_OFF is a value for obtain successively read two symbol's memory inter-location offset RD_OFF, if it is bigger or same as N, as in FIG. 10, then accept the "modulo" calculation to being the RD_OFF, and it can be denoted a WR_OFF*per column symbol number B. The initial value of the WR_OFF is 1, then the MID_OFF is being B, smaller than N, so same as the RD_OFF. At this time, if TTI is 10 ms, the interleavig is not performed, so the MID_OFF is being 1.

And an "i" means an index of currently inputted symbol, initial value is 0 and increased in linear to 1. A MAX_B and a JMP_OFF is a variable for considering data rate change, their initial value is 0 and reformed by frame unit. The value of the MAX_B is reformed by comparing to value of B, to the larger value and when the value of B is changed from bigger to smaller, that is, when data rate is decreased, the JMP_OFF increase index by an unused region, and made the same stream control possible.

In 920 processes, two operations are performed as described in FIG. 10.

First, if the MID_OFF is bigger or same as a frame symbol number N, then take the "modulo" calculation to obtain the RD_OFF 1020, and if the MID_OFF is smaller than the frame symbol number N, then the MID_OFF is the RD_OFF 1080.

The the COL_OFF is calculated by the above value and it is needed in the following reason. Different from the general block interleaving, in the IMT-2000, the interleaving is followed by the inter-column substitution. It makes a generalization between an input symbol and an output symbol difficult. Because a regulation between a reading symbol index and a writing symbol index are broken by the inter-column substitution. To repair this, the input symbol is recorded in the deinterleaver RAM 810 according to the present invention. If TTI is 40 ms, then the column number is 4, and according to the inter-column substitution, a $0^{th}$ column is inputted firstly, and a second column is followed. However, in the COL_OFF, the second column is not followed directly to the $0^{th}$ column and recorded in the deinterleaver RAM 810 after make an offset as much as the first column offset. A formula of the COL_OFF is as below.

$$COL\_OFF<=DIFF\_COL\_ID \times RD\_OFF; \quad (13)$$

if COL_OFF≧N then $$COL\_OFF<=COL\_OFF \bmod (N-1); \quad (14)$$

end if;

And as in [table 1], in case of TTI are 10 ms and 20 ms, the inter-column substitution is not carried out and the COL_OFF is being 0 1040, and in case of the inter-column substitution is carried out, the COL_OFF can be calculated like in formula 13 or 1050 process. In this case, check whether the value of the COL_OFF is bigger than N or not, and if it is bigger or same as N, then adopt the "modulo" calculation as in formula 13 or 1070 process.

After obtaining the medium variable, waiting for a frame_sync signal of the first column of the first frame. In here, the frame_sync is a kind of synchronous adapting signal, which denotes an inputting of a column data for performing the deinterleaving. Different from interleaver, the deinterleaver inputs plural bits per symbol and make it carries out soft decision in a channel decoder.

Therefore, two cases of memory operations are considerable.

First is plural symbols which corresponding one symbol, that is, in case of [table 2], allot 6 bits in one address, in this case the WR_IDX or the RD_IDX themselves are being an address of the memory and the reading operation before the writing operation is not needed.

Second is one bit per one symbol in one address and first and the whole memory size is same, but it being a kind of parallel structure. It can cope with actively when a channel decoder required bit number is changed. In here, second assumption is emphasized.

Basically there used one memory, so firstly read the address of writing position of currently inputted symbol, and only cover those data by currently inputted symbol. For this, after read the corresponding address 930, check whether a wr_strobe signal is 1 or not, and if it is not 1, then carry out again until it being 1, and if it is 1, then make a mask for cover the data of the writing position 940. In here, the wr_strobe signal is a kind of control signal, which denotes the validity of inputted symbol. And in the mask, an input symbol is "0", then only made the position to 0 (the other is 1) and carried out conjunction with the 430 process reading data, and if the input symbol is 1, then only made the position to 1(the other is 1) then, carried out disjunction with the 430 process reading data.

At this time, two things are considered. One is using the Dual Port RAM in the memory, and the other is using the Single Port RAM in the memory, consideration between reading and writing operation relationship. When using the Dual Port RAM, reading and writing is operated respectively, so can control easily and obtain bigger timing margin, but size and energy consumption is increased. So, if it has enough timing, then using the Single Port RAM is more effective. Reading and writing relationship in using the Single Port RAM is as following.

It is a treating matter while the deinterleaving reading operation is performing, data of the next frame is inputted. In General, an internally operated reading operation performing speed is faster, but in worst case, if reading and writing operation speed is same, then the two operation have to be performed in turn. That is, when only the reading operation is performing, the reading operation is happened in each cycle, when the reading operation and the writing operation is folded, the writing operation has precedence, and in worst case, they can be operated in turn. When a symbol of a next frame is inputted during the reading operation is performing, then the writing operation has to be preceded. FIGS. 9a and 9b are considered that operation. So when the mask making processing 940 for only cover inputted symbol, a rd_strobe "1" means reading operation is possible. Finally, read a corresponding address once for carrying out a writing operation during a reading process 930 of corresponding memory, make a mask for writing only 940 process inputted symbol and at the same time carry out a reading process for the real deinterleaving, in 950 process carry out disjunction or conjunction between the mask and 930 process read data for write the result in memory, then increase a WR_IDX as much as a WR_OFF. And check whether the whole symbols are recorded in memory or not, then if all of symbols are not recorded in frame, that is, in case of "i" is smaller than N−1, then comparing "i" and a column symbol number B 952, and if the column is increased, then the WR_IDX+the COL_OFF+the JMP_OFF are being a position for recording the first symbol of a next column 853. After that, repeat a frame_sync signal waiting process 920 again, and if the column is not increased, repeat from the corresponding memory reading 930 and if "i" is bigger or same as N−1, it will be described in a second frame medium variable obtaining process.

The first frame writing needed medium variable formula is as below.

Initial value:
WR_OFF<=1;
WR_IDX<=0;
JMP_OFF<=0;
MID_OFF<=B;
Computed value:
RD_OFF<=MID_OFF;
COL_OFF<=RD_OFF×DIFF_COL_IDX;
if I=0 then
WR_IDX<=0;
Elseif (I mod B)/=0 then $$WR\_IDX<=WR\_IDX+WR\_OFF; \quad (15)$$

else $$WR\_IDX<=WR\_IDX+WR\_OFF+JMP\_OFF+COL\_OFF; \quad (16)$$

end if;
if WR_IDX≧N then
WR_IDX<=WR_IDX−(N−1);
end if;

In this case, the JMP_OFF of the formula 16 can be omitted.

Now examine how the medium variable for the first frame is calculated and how the second frame is reading.

After record the whole frame, make a rd_start which permitting a reading operation for the deinterleaving to 1 960, and check whether the information of the second frame is inputted or not 970, then if not inputted, repeat the operation again, and inputted an information of the second frame. After that, redefine of the medium variable for the second frame is proceeded and the WR_OFF has to be written in the first frame reading sequence so the RD_OFF of the first frame is being the WR_OFF of the second frame. Then check data rate change 880, if there is no change or increase, the MAX_B is reformed to B, and the JMP_OFF is being 0 982, and if it decrease, the MAX_B calculate the JMP_OFF 981. At this time, in the JMP_OFF and N 990, if N is bigger than the JMP_OFF, then performing the "modulo" calculation, so the MID_OFF of next frame is the WR_OFF*B 991, and repeat 920 process, and if N is smaller, then by performing the "modulo" calculation obtain the JMP_OFF, and then proceed to 991 process.

The medium variable for the second frame is as below.

$$WR\_OFF<=RD\_OFF; \quad (17)$$

if MAX_B>B then
JMP_OFF<=(MAX_B−B)×WR_OFF;
If JMP_OFF>(N−1) then
    JMP_OFF<=JMP_OFF mod (N−1);
end if;
else
MAX_B<=B;
JMP_OFF<=0;
end if;

$$MID\_OFF<=WR\_OFF\times B; \quad (18)$$

if MID_OFF<N then $$RD\_OFF<=MID\_OFF \quad (19)$$

else $$MID\_OFF<=MID\_OFF \bmod (N-1); \quad (20)$$

end if;

In this case, in formula (17) WR_OFF=RD_OFF, so, formula 18 can be denoted to MID_OFF=RD_OFF×B. After obtain the medium variable for the next frame, then proceed to 921 process which waiting for the frame_sync signal.

FIG. 11 describes a reading method of a written symbol of FIG. 9a, FIG. 9b and FIG. 10 to the deinterleaving sequence. In FIG. 11, a rd_start generating process 960 of FIG. 9a and FIG. 9b is described. The RD_OFF of FIG. 10 is latched in 1110 processing then initializes j to 0 for calculating interleaving symbol number 1110. In this case, the Single Port RAM is used, reading and writing happens simultaneously, and priority ranking is in writing operation.

After this, check whether a writing operation is in performing or not 1120, and a reading operation is in performing, then read the memory in the deinterleaving sequence 1140, and if the writing operation is performing, check whether the rd_strobe signal is 1 or not, and if it isn't 1, waiting until the rd_strobe signal is being 1, and if it is 1, then read the memory in the interleaving sequence 1140. After this, compare j and N−1 for checking the entire frame corresponded symbols are read in the deinterleaving sequence.

In case of j is smaller than N−1, that is, a symbol for performing the interleaving is remained, increasing 1160 a RD_IDX to a RD_OFF, J to 1 and then performing 1120 process again.

The RD_IDX formula can be described as below.
RD_IDX<=RD_IDX+RD_OFF;
if RD_IDX≧N then
RD_IDX<=RD_IDX (N−1);
end if;

FIG. 12 is a diagram showing an inter-column included block interleaved data's deinterleaving performing process in accordance with the present invention, if a transmission time interval is 40 ms, and size of handling frame N is 24 symbols, as can be known in [table 1], a column number C is 4, and symbol number B is 6. For convenience, data width of the deinterleaver RAM 810 is supposed to 8 bit, and a calculation method of other medium variable is as described above.

First, examine a writing of a first frame. The 1220 process shows before the interleaving source symbol's array in 4×6 structure. The result emphasis the column. After the interleaving symbols are shown in 1230 process, and the sequence of column-1 and column-2 is changed. The deinterleaver always input symbols in 1230 process sequence. A 1240 process shows the first frame recording sequence. As described in FIGS. 9a and 9b, an initial of a WR_OFF is 1 and WR_IDX=WR_IDX+WR_OFF, so it increase as much as 1 in linear, then record the interleaved input symbols in the deinterleaver RAM 810. At this time, the 3 lower bits of the WR_IDX is being an address in 8 bits deinterleaver RAM and the rest is being a real address. That is, if the WR_IDX is 1, then it is "~000001" in binary number and means cover currently inputted symbol among the 8 bits in 0 address to second bit −1, and if the WR_IDX is 12, then it is "~001100" in binary number and means write among the 8 bits in 1 address to fifth bit −4. The written result of the first column of the first frame is denoted in the first column of 1250 process. That is, from the left side (0 bit of 0 address) of the deinterleaver memory, records a source symbol index 0, the source symbol index 4 in bit −1, the source symbol index 8 in bit −2, the source symbol index 12 in bit −3, the source symbol index 16 in bit −4, and record a last symbol 20 of the first column in bit −5. Hereinafter, the WR_IDX for recording the next symbol is increase 1 and being 6, but in case of the inter-column substitution the first symbol of the third column 2 is inputted. That is, index of a next column is being 2, not 1, so a DIFF_COL_IDX= 2−1=1 and the COL_OFF=DIFF_COL_IDX×B=1×6=6, then the WR_IDX is increased to WR_IDX=WR_IDX+ COL_OFF+JMP_OFF=6+6+0=12. At this time, the JMP_ OFF is 0 for data rate is not decreased. Therefore index of the source symbol 2 is recorded in 1 address, bit −4 because the WR_IDX is 12. And index 6 of the next symbol is recorded the WR_IDX+1=13, that is, 1 address, bit −5 of the deinterleaver RAM 810, index 10 of the source symbol is recorded in 14, that is, 1 address, −6 bit of the deinterleaver RAM 810, index 14 of the source symbol is recorded in 15, that is, 1 address, −7 bit of the deinterleaver RAM 810, index 18 of the source symbol is recorded in 16, that is, 2 address, −0 bit of the deinterleaver RAM 810 and index 22 of the source symbol is recorded in 17, that is, 2 address, −1 bit of the deinterleaver RAM 810. The WR_IDX for record next symbol is 18 by increasing 1, but because of the column change, to restore the inter-column substitution, it should calculate the DIFF_COL_IDX and the COL_OFF. Because an index of the next column is 1, not 3, the DIFF_COL_IDX=1−3=−2 and the COL_OFF=−2×6=− 12, so the WR_IDX=18−12=6. After that, the inputted source symbols of the second column have to increase the WR_IDX to 1, then after record the last symbol of the second column 21, performing the DIFF_COL_IDX and the COL_OFF calculation for restore the inter-column substitution. At this time, the DIFF_COL_IDX=3−2=1 and the COL_OFF=1 ×6=6, so the WR_IDX=12+6=18. For record the fourth column increase the WR_IDX as much as 1 and record it to the deinterleaver RAM 810. The above processing method is shown in 1250 process. After record the whole first frame, the RD_OFF value is determined as shown in the first column of 1260 process, and following to the above description, the initial MID_OFF is B, so it being 6 and the value is smaller than N value 24, so it is being the RD_OFF. After determine the RD_OFF, the RD_IDX read the corresponding index by add the RD_OFF in linear. In this case, as in the WR_IDX, among the 8 bits of corresponding address of the deinterleaver memory, lower 3 bits are used for denote one symbol and the rest are being an address of the real deinterleaver memory. In 1260 process, an initial value of the RD_IDX is 0, and adds the RD_OFF for read second symbol, it being 0+6=6. And add the RD_OFF again for reading the third symbol, it being 6+6 =12, in this way, the fourth is being 18, the fifth is being 24, and the value is bigger than N value 24, so delete N−1 value. That is, 24−23=1.

And then, the next RD_IDX illustrating adds the RD_OFF, 1+6=7, 7+6=13, . . . , 17+6=23. In this case, if the value is bigger than or same as N value 24, then delete N−1 value. In 1270 process, the second block recording process is illustrated. At this time, in the first frame reading sequence, second frame should recorded so the RD_OFF, 6, of the first frame is being the WR_OFF of the second frame then increase the WR_IDX as much as 6, after writing method is same as the first frame. Just like the first frame, it should calculate the DIFF_COL_IDX and the COL_OFF when the column is changed for restoring the inter-column substitution and at this time the WR_IDX should increase as much as the COL_OFF. The 1280 process shows the result of the second frame, which recorded by 1270 process method, and 1290 process shows a calculating method of the RD_OFF for reading the second frame and calculation process of the RD_IDX.

The RD_OFF of the second frame is the WR_OFF×B, so 6×6=36 and cause this value is bigger than N, it take the "modulo" process, 36 mod 23=13. Therefore, the RD_IDX for reading the second frame is increase in linear as much as 13, and if the RD_IDX is bigger than or same as N, then delete N−1. Through the RD_IDX, the deinterleaver RAM 810 is read in the same method of the first frame. The WR_OFF of the third frame is being the RD_OFF of the second frame, and the reading and writing operation in the above is repeated.

The interleaving/deinterleaving performing method with an address generator, according to the present invention including the steps of storing the source data (interleaving) of the frame (block) for the interleaving/deinterleaving performing or the interleaved data (deinterleaving) frame block in the memory, and if the storing frame is a former frame, during the interleaving/deinterleaving the former frame, the next corresponded symbol is inputted and need the memory which can store it, and for the next frame corresponded symbol, not add the memory, then write according to the previous symbol reading position.

As described above, the present invention, have an effect that by using the interleaving and the deinterleaveing, the IMT-2000 modem can down-sizing the required memory size about 40%.

That is, the present invention has an effect that downsizing memory size by performing the interleaving and the deinterleaving using only one memory, one chip of modem, which can support high data rate, required service Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for interleaving data, comprising:
   an interleaving storing means for storing sequence which is inputted from a writing address generating means and from a first and a second selecting means;
   the writing address generating means for obtaining inter-location offset (WR_OFF) of the interleaving storing means on which symbols are to be written in order to perform a writing operation and for generating a writing address to be practically written on a location of data which is previously read, data and a memory control signal;
   an address offset generating means for receiving a middle value (MID_OFF) and a start signal (cal_start) from the writing address generating means, the middle value and the start signal being used for obtaining an offset between an interlocation offset (RD_OFF) of the interleaving storing means, and for generating intermediate variables (COL_OFF) which are used for the inter-location offset (RD_OFF) of the interleaving storing means and an inter-column substitution of the data;
   a reading address generating means for generating increasing the address offset generating means originated signal to as much as a symbol's memory inter-location offset (RD_OFF) and create an address for reading the interleaving storing means to generate memory control signal;
   the first and the second selecting means for selecting appropriate signal between a control signal and address in the writing address generating means and the reading address generating means transferred writing operation needed reading operation, and in a real interleaving operation needed reading operation; and
   a third selecting means for selecting appropriate symbol in the interleaving storing means output signal which are generated from the reading operating, and performed from the reading address generating means transferred interleaving.

2. The apparatus as recited in claim 1, wherein using one memory, in an interleaving sequence, then write next data considering an inter-column substitution.

3. The apparatus as recited in claim 1, wherein the writing address generating means calculates a medium variable JMP_OFF which receives a changing data rate by using a memory inter-location offset (WR_OFF).

4. The apparatus as recited in claim 3, the writing address generating means reading an address for writing in the interleaving storing means and make a mask for carrying out a conjunction and disjunction in accordance with the data value is 1 or 0, then records the result to a memory for only cover a corresponding symbol.

5. An apparatus for deinterleaving data, comprising:
   a deinterleaving storing means for sequence storing which is inputted from a writing address generating means and from a first and a second selecting means;
   the writing address generating means for demanding a memory inter-location offset (WR_OFF) to performing a writing operation in the deinterleaving storing means memory block and for generating a practically writing address which is a location of data that previously read, data and memory control signal;
   an address offset generating means for inputting a middle value (MID_OFF) and a start signal (cal_start) for demand a memory inter-location offset (RD_OFF) from the writing address generating means, to read in a deinterleaving sequence and for generating an intermediate variable (COL_OFF) which is used for a memory inter-location offset (RD_OFF) and an inter-column substitution;
   a reading address generating means for increasing the address offset generating means originated signal to as much as a symbol's memory inter-location offset (RD_OFF) and create an address for reading the deinterleaving storing means to generates a memory control signal;
   the first and the second selecting means for selecting an appropriate signal between a control signal and an address in the writing address generating means and the reading address generating means transferred writing operation needed a reading operation, and in a real interleaving operation needed reading operation; and
   a third selecting means for selecting an appropriate symbol in the memory output signals which are generated from the reading operation, and performed from the reading address generating means transferred deinterleaving.

6. The apparatus as recited in claim 5, wherein using one memory, in the deinterleaving sequence, then write next data considering an inter-column substitution.

7. The apparatus as recited in claim 5, wherein the writing address generating means calculates a medium variable JMP_OFF which receives a changing data rate.

8. The apparatus as recited in claim 7, the writing address generating means reading an address for writing in the de-interleaving storing means and make a mask for carry out a conjunction and disjunction in accordance with the data value is 1 or 0, then record the result to a memory for only cover a corresponding symbol.

9. A channel encoding system with an interleaving/deinterleaving performing device, comprising:
   an encoding means for encoding an inputted source's data column;
   an interleaving means for performing an inter-column included block interleaving, to the encoding means transferred data;
   a modulating means for modulating a block interleaved data through the interleaving means and transfer it through a channel;
   a demodulating means for demodulating the block interleaved data which is modulated through the modulating means;
   a deinterleaving means for performing an inter-column substitution included block deinterleaving to the block interleaved data which is demodulated through the demodulating means; and
   a decoding means for decoding the deinterleaved data by the deinterleaving means, wherein the interleaving means includes:
     an interleaving storing means for sequence storing which is inputted from a writing address generating means and from a first and a second selecting means;
     the writing address generating means for demanding a memory inter-location offset (WR_OFF) to performing a writing operation in the interleaving storing means memory block and for generating a practically writing address, data and a memory control signal;

an address offset generating means for inputting a middle value (MID_OFF) and a start signal (cal_start) for demanding a memory inter-location offset (RD_OFF) from the writing address generating means, to reading in an interleaving sequence and for generating an intermediate variable (COL_OFF) which is used for a memory inter-location offset (RD_OFF) and an inter-column substitution;

a reading address generating means for increasing the address offset generating means originated signal to as much as a symbol's memory inter-location offset (RD_OFF) and creates an address for reading the interleaving storing means to generate a memory control signal;

the first and the second selecting means for selecting appropriate signal between a control signal and an address in the writing address generating means and the reading address generating means transferred writing operation needed reading operation, and in a real interleaving operation needed reading operation; and a third selecting means for selecting appropriate symbol in the memory output signals which are generated from the reading operation, and performed from the reading address generating means transferred interleaving.

10. The channel encoding system with the interleaving/deinterleaving performing device as recited in claim 9, in performing the interleaving/deinterleaving using for data burst error correction, restoring an inter-column substitution by generating an address, and using one memory, by the interleaving/deinterleaving sequence, considering the inter-column substitution then, writes next data.

11. The channel encoding system with the interleaving/deinterleaving performing device as recited in claim 9 and claim 10 wherein the deinterleaving means comprising:

a deinterleaving storing means for sequence storing which is inputted from a writing address generating means and from a first and a second selecting means;

the writing address generating means for demanding a memory inter-location offset (WR_OFF) to performing a writing operation in the deinterleaving storing means memory block and for generating a practically writing address, data and memory control signal;

an address offset generating means for inputting a middle value (MID_OFF) and a start signal (cal_start) for demanding a memory inter-location offset (RD_OFF) from the writing address generating means, to reading in a deinterleaving sequence and for generating an intermediate variable (COL_OFF) which is used for a memory inter-location offset (RD_OFF) and an inter-column substitution;

a reading address generating means for increasing the address offset generating means originated signal to as much as a symbol's memory inter-location offset (RD_OFF) and create an address for reading the deinterleaving storing means to generate memory control signal;

the first and the second selecting means for selecting an appropriate signal between a control signal and an address in the writing address generating means and the reading address generating means transferred writing operation needed reading operation, and in a real interleaving operation needed reading operation; and a third selecting means for selecting appropriate symbol in the memory output signals which are generated from the reading operation, and performed from the reading address generating means transferred deinterleaving.

12. A method for interleaving data, comprising the steps of:

a) storing input sequence of a writing address generator, a first and a second multiplexing device;

b) obtaining a memory inter-location offset (WR_OFF) in a successivly inputted symbol, which will be written, and for performing a writing operation in the stored memory block;

c) generating a memory inter-location offset (RD_OFF) which is an inputting middle value and a start signal (cal_start) for reading it in an interleaving sequence, and a medium variable (COL_OFF) which is used in an inter-column substitution;

d) increasing the generated signal to a successively readable symbol's memory inter-location's offset (RD_OFF), and a generating memory control signal for reading data stored in interleaver RAM;

e) selecting a corresponding cycle needed signal between the reading address generator and a writing address generator transferred writing operation needed reading operation and real interleaving performing needed reading operation's control signal and address; and f) selecting a corresponding symbol among the memory output signals that are generated by the reading address generator transferred interleaving performing reading operation.

13. The method as recited in claim 12, wherein using only one memory and considering an inter-column substitution then record next data in interleaving sequence.

14. The method as recited in claim 13, wherein the step b), carrying out a reading operation without chainging in case of the data rate increasing, and skipping an unused memory region in case of the data rate decreasing.

15. The method as recited in claim 14, wherein the step b) includes the steps of:

g) initializing interleaving medium variables (I=0; WR_OFF=1, MID_OFF=C, MAX$_{13}$ B=B; JMP_OFF=0);

h) waiting for a first frame signal frame_sync;

i) inputting the first frame signal frame_sync and reading a corresponding address from the interleaver RAM;

j) checking the interleaver RAM data and wr_strobe signal, and carrying out disjunction or conjunction for covering a corresponding symbol by mask, and then records it in the memory block address;

k) reading a corresponding address for recording a second symbol of the read frame signal (frame_sync), and after checking a wr_strobe signal, carrying out disjunction or conjunction for covering a corresponding symbol by mask, and then records it in the interleaver RAM; and l) recording symbols of the whole frame by the writing address generator, then generating an interleaving performing signal (rd_start) to a reading an address generator.

16. The method as recited in claim 12, wherein the step c) step includes the steps of:

g) inputting a MID_OFF in the initialized medium variables and checking if the MID_OFF is smaller than frame symbol number N or not;

h) checking the result of the step g), and if the MID_OFF is bigger than or same as N, then take "modulo"

operation to obtain the RD_OFF, and if the MID_OFF is smaller than N, then it being a MID_OFF;

i) according to the value, determining whether performing the inter-column substitution or not;

j) checking the result of the step i), and if the inter-column substitution is not performed, then the COL_OFF is 0, and if the inter-column substitution is performed, then calculate the COL_OFF by using WR_OFF*DIFF_COL_IDX;

k) checking whether the COL_OFF value is bigger than N or not; and l) taking the "modulo" operation using the COL_OFF mod (N−1) if the COL_OFF value is bigger than or the same as N.

17. The method as recited in claim 12, wherein the step d) includes the steps of:

g) initializing an interleaving symbol number counting variable j to 0 by latching the RD_OFF when a rd_start signal is generated;

h) checking whether a writing operation is performing or not, and if a reading operation is performing, then read memory in an interleaving sequence, and if the writing operation is performing, then check whether the rd_strobe signal is 1 or not;

i) checking the result of the step h), and if the rd_strobe signal is not 1, then repeat performing until it being 1, and if the rd_strobe is 1, then read memory in an interleaving sequence;

j) comparing j and N−1 for checking if a whole frame is read in an interleaving sequence or not;

k) checking the result of the j) step, and if j is smaller than N−1, then increase the RD_IDX to the RD_OFF for read next symbol, and increase j to 1, then take "modulo" operation in j=B−1 for checking column changing; and l) going to the step h) after increasing the RD_IDX to the COL_OFF if the value is 0, and going to the step h) if the value is not 0.

18. A method for deinterleaving data, comprising the steps of:

a) storing frame symbol of inputted from writing address generator, a first and a second multiplexing device;

b) obtaining a memory deinter-location offset (WR_OFF) in a successively inputted symbol which will be written, and for performing a writing operation in the stored memory block;

c) generating a memory inter-location offset (RD_OFF) which is inputting a middle value and a start signal (cal_start) for reading it in a deinterleaving sequence, and a medium variable (COL_OFF) which is used in an inter-column substitution restoration;

d) increasing the generated signal to a successively readable symbol's memory inter-location's offset (RD_OFF), and generating a memory control signal for reading data stored in interleaver RAM;

e) selecting a corresponding cycle needed signal between the reading address generator and the writing address generator transferred writing operation needed reading operation and a real interleaving performing needed reading operation's control signal and address; and f) selecting a corresponding symbol among the memory output signals that are generated by the reading address generator transferred deinterleaving performing reading operation.

19. The method as recited in claim 18, wherein using only one memory and considering the inter-column substitution then records next data in a deinterleaving sequence.

20. The method as recited in claim 19, wherein the step c) includes the steps of:

g) inputting a MID_OFF in the initialized medium variables and checking if the MID_OFF is smaller than frame symbol number N or not;

h) checking the result of the step g), and if the MID_OFF is bigger than or the same as N, then take "modulo" operation to obtain the RD_OFF, and if the MID_OFF is smaller than N, then it being the MID_OFF;

i) according to the value, determining whether performing the inter-column substitution or not;

j) checking the result of the i) step, and if the inter-column substitution is not performed, then the COL_OFF is 0, and if the inter-column substitution is performed, then calculate the COL_OFF by using WR_OFF*DIFF_COL_IDX;

k) checking whether the COL_OFF value is bigger than N or not; and l) taking the "modulo" operation using the COL_OFF mod (N−1) if the COL_OFF value is bigger than or the same as N.

21. The method as recited in claim 19, wherein the step d) includes the steps of:

g) initializing a deinterleaving symbol number counting variable j to 0 by latching the RD_OFF when an rd_start signal is generated;

h) checking whether a writing operation is performing or not, and if a reading operation is performing, then reading memory in a deinterleaving sequence, and if the writing operation is performing, then check whether the rd_strobe signal is 1 or not;

i) checking the result of the step h), and if the rd_strobe signal is not 1, then repeat performing until it being 1, and if the rd_strobe is 1, then reading memory in the deinterleaving sequence;

j) comparing j and N−1 for checking the whole frame is read in the deinterleaving sequence; and k) checking the result of the step j), and if j is smaller than N−1, then increase the RD_IDX to the RD_OFF for reading next symbol, and increase j to 1, then repeat from the step h).

22. The method as recited in claim 18, wherein the b) step comprising the steps of:

g) initializing deinterleaving medium variables (I=0; WR_$_{OFF}$=1, MAX_B=B, JMP_OFF=0)

h) waiting for a first frame signal frame_sync;

i) inputting the first frame signal frame_sync and reading a corresponding address from deinterleaver RAM;

j) checking the deinterleaver RAM data and the wr_strobe signal, and carrying out disjunction or conjunction for covering a corresponding symbol by mask, and then records it in the memory block address;

k) reading a corresponding address for recording second symbol of the read frame signal (frame_sync), and after checking the wr_strobe signal, carrying out disjunction or conjunction for covering a corresponding symbol by mask, and then records it in the deinterleaver RAM; and l) recording symbols of a whole frame by the writing address generator, then generating an interleaving performing signal (rd_start) to a reading address generator and generating RD_OFF.

23. The method as recited in claim 22, wherein the step j) reading a currently inputted symbol writing address, and reading the data for cover it to a currently inputted symbol, then make a mask after checking the wr_strobe signal, if an input symbol is 0, then make the writing position to 0 and the rest to 1, then performing conjunction with the read data. If an input symbol is 1, then make the writing position to 1 and the rest to 0, then write the result of conjunction with the read data to corresponding position of memory.

24. A method for interleaving/deinterleaving data method, comprising the steps of:
 a) handling an interleaving/deinterleaving performing source data (interleaving)'s frame (block) or an interleaved data (deinterleaving) frame block, storing it in a memory;
 b) regarding the storing frame as a former frame, during the interleaving/deinterleaving the former frame next corresponded symbol is inputted and need the memory which can store it; and
 c) writing according to the previous symbol reading position for the next frame corresponded symbol, without adding the memory,
 wherein the step a), for interleaving source data, includes the steps of:
  a) storing input sequence of a writing address generator, a first and a second multiplexing device;
  b) obtaining a memory inter-location offset (WR_OFF) in a successively inputted symbol, which will be written, and for performing a writing operation in the stored memory block;
  c) generating a memory inter-location offset (RD_OFF) which is an inputting middle value and a start signal (cal_start) for reading it in an interleaving sequence, and a medium variable (COL_OFF) which is used in an inter-column substitution;
  d) increasing the generated signal to a successively readable symbol's memory inter-location's offset (RD_OFF), and a generating memory control signal for reading data stored in interleaver RAM;
  e) selecting a corresponding cycle needed signal between the reading address generator and a writing address generator transferred writing operation needed reading operation and real interleaving performing needed reading operation's control signal and address; and
  f) selecting a corresponding symbol among the memory output signals that are generated by the reading address generator transferred interleaving performing reading operation.

25. The method as recited in claim 24, wherein the step a), for deinterleaving data source, includes the steps of:
 a) storing frame symbol of inputted from writing address generator, a first and a second multiplexing device;
 b) obtaining a memory deinter-location offset (WR_OFF) in a successively inputted symbol which will be written, and for performing a writing operation in the stored memory block;
 c) generating a memory inter-location offset (RD_OFF) which is inputting a middle value and a start signal (cal_start) for reading it in a deinterleaving sequence, and a medium variable (COL_OFF) which is used in an inter-column substitution restoration;
 d) increasing the generated signal to a successively readable symbol's memory inter-location's offset (RD_OFF), and generating a memory control signal for reading data stored in interleaver RAM;
 e) selecting a corresponding cycle needed signal between the reading address generator and the writing address generator transferred writing operation needed reading operation and a real interleaving performing needed reading operation's control signal and address; and
 f) selecting a corresponding symbol among the memory output signals that are generated by the reading address generator transferred deinterleaving performing reading operation.

26. A computer readable recording media comprising:
 a first function for correcting a burst error of data, using one memory, considering an interleaving sequence followed read position, for writing a next data, in processor possessed interleaving performing device, inputting a writing address generator and a first and a second multiplex device, storing input sequence;
 a second function for performing the writing operation in the stored memory block, demanding a sucessively inputted symbol used memory inter-location offset (WR_OFF), generating a real usable address, data, and a memory control signal;
 a third function for generating an inter-column substitution used medium variable (COL_OFF) and a memory inter-location offset (RD_OFF) for inputting a medium value (MID_OFF) and a start signal (cal_start), and reading it the interleaving sequence;
 a fourth function for increasing the generating signal to as much as successively readable symbol inter-location's offset (RD_OFF), and making an address for read an above stored interleaver RAM, then generating memory control signal;
 a fifth function for selecting respectively among the reading operations which is needed for the writing address generator and reading address generator transferred writing operation and a real interleaving performing needed reading operation's control signal and an address; and
 a sixth function for selecting corresponding symbol between the reading address generators transferred interleaving performing reading operation generated memory output signals.

27. A computer readable recording media comprising:
 a first function for correcting a burst error of data, using one memory, considering a deinterleaving sequence followed read position, for writing next data, in a processor possessed deinterleaving performing device, inputting a writing address generator and a first and a second multiplex device, storing input sequence;
 a second function for performing a writing operation in the stored memory block, demanding a successively inputted symbol used memory inter-location offset (WR_OFF), generating a real usable address, data, and a memory control signal;
 a third function for generating an inter-column substitution restore used medium variable (COL_OFF) and a memory inter-location offset (RD_OFF) for inputting a medium value (MID_OFF) and a start signal (cal_start), and reading it a deinterleaving sequence;
 a fourth function for increasing the generating signal to as much as a successively readable symbol inter-location's offset (RD_OFF), and making an address for reading an above stored deinterleaver RAM, then generating a memory control signal;

a fifth function for selecting respectively between the reading operation which is needed for the writing address generator and a reading address generator transferred a writing operation and a real interleaving performing needed reading operation's control signal and address; and a sixth function for selecting a corresponding symbol between the reading address generator transferred deinterleaving performing reading operation generated memory output signals.

* * * * *